(12) United States Patent
Davis

US009688540B2

(10) Patent No.: US 9,688,540 B2
(45) Date of Patent: Jun. 27, 2017

(54) SEGMENTED GRAPHENE GROWTH ON SURFACES OF A PATTERNED SUBSTRATE LAYER AND DEVICES THEREOF

(71) Applicant: Solan, LLC, Salt Lake City, UT (US)

(72) Inventor: Mark Alan Davis, Springville, UT (US)

(73) Assignee: Solan, LLC, Salt Lake City, UT (US)

( * ) Notice: Subject to any disclaimer, the term of this patent is extended or adjusted under 35 U.S.C. 154(b) by 0 days.

(21) Appl. No.: 14/761,290

(22) PCT Filed: Jan. 15, 2014

(86) PCT No.: PCT/US2014/011683
§ 371 (c)(1),
(2) Date: Jul. 15, 2015

(87) PCT Pub. No.: WO2014/113472
PCT Pub. Date: Jul. 24, 2014

(65) Prior Publication Data
US 2015/0360954 A1    Dec. 17, 2015

Related U.S. Application Data

(60) Provisional application No. 61/752,961, filed on Jan. 15, 2013.

(51) Int. Cl.
| | |
|---|---|
| *H01L 21/02* | (2006.01) |
| *H01L 21/20* | (2006.01) |
| *H01L 29/66* | (2006.01) |
| *C01B 31/04* | (2006.01) |
| *C01B 31/02* | (2006.01) |
| *C01B 31/00* | (2006.01) |
| *H01L 21/285* | (2006.01) |
| *C23C 16/04* | (2006.01) |
| *C23C 14/06* | (2006.01) |
| *C23C 16/26* | (2006.01) |
| *C23C 14/34* | (2006.01) |
| *H01L 29/16* | (2006.01) |
| *H01L 29/41* | (2006.01) |

(52) U.S. Cl.
CPC .......... *C01B 31/0446* (2013.01); *C01B 31/00* (2013.01); *C01B 31/0213* (2013.01); *C01B 31/0226* (2013.01); *C01B 31/0293* (2013.01); *C01B 31/04* (2013.01); *C01B 31/0438* (2013.01); *C01B 31/0453* (2013.01); *C01B 31/0461* (2013.01); *C23C 14/0605* (2013.01); *C23C 14/34* (2013.01); *C23C 16/04* (2013.01); *C23C 16/26* (2013.01); *H01L 21/02* (2013.01); *H01L 21/0226* (2013.01); *H01L 21/0237* (2013.01); *H01L 21/0262* (2013.01); *H01L 21/02104* (2013.01); *H01L 21/02115* (2013.01); *H01L 21/02225* (2013.01); *H01L 21/02263* (2013.01); *H01L 21/02266* (2013.01); *H01L 21/02271* (2013.01); *H01L 21/02296* (2013.01); *H01L 21/02318* (2013.01); *H01L 21/02527* (2013.01); *H01L 21/02587* (2013.01); *H01L 21/02628* (2013.01); *H01L 21/02631* (2013.01); *H01L 21/02636* (2013.01); *H01L 21/02645* (2013.01); *H01L 21/2855* (2013.01); *H01L 21/28556* (2013.01); *H01L 21/28562* (2013.01); *H01L 29/1606* (2013.01); *H01L 29/66015* (2013.01); *H01L 29/413* (2013.01)

(58) Field of Classification Search
CPC .............. H01L 21/02; H01L 21/02104; H01L 21/02115; H01L 21/0226; H01L 21/02263; H01L 21/02266; H01L 21/02271; H01L 21/02296; H01L 21/02318; H01L 21/02527; H01L 21/02631; H01L 21/02636; H01L 21/02645; H01L 21/28512; H01L 21/2855; H01L 21/28556; H01L 21/28562; H01L 29/1606; H01L 29/66015; C23C 14/0605; C23C 14/34; C23C 16/04; C23C 16/26; C01B 31/00; C01B 31/0213; C01B 31/0226; C01B 31/0293; C01B 31/04; C01B 31/0438; C01B 31/0446; C01B 31/0453; C01B 31/0461
USPC ................ 427/96.8, 98.6, 122, 249.1, 249.6; 977/734
See application file for complete search history.

(56) References Cited

U.S. PATENT DOCUMENTS

| | | | | |
|---|---|---|---|---|
| 2011/0032753 | A1* | 2/2011 | An ......................... | G11C 11/56 365/163 |
| 2012/0267729 | A1* | 10/2012 | Dang ..................... | B82Y 15/00 257/414 |

OTHER PUBLICATIONS

Kim et al., "Growth of CVD graphene on copper by rapid thermal processing," Mater. Res. Soc. Symp. Proc., vol. 1451, 2012, 6 pages.*

(Continued)

*Primary Examiner* — William Phillip Fletcher, III
(74) *Attorney, Agent, or Firm* — Morgan Lewis & Bockius LLP

(57) ABSTRACT

A method of forming a graphite-based structure on a substrate comprises patterning the substrate thereby forming a plurality of elements on the substrate. Each respective element in the plurality of elements is separated from an adjacent element on the substrate by a corresponding trench in a plurality of trenches on the substrate and each respective element in the plurality of elements has a corresponding top surface. The method further comprises segmentedly depositing a graphene initiating layer onto the top surface of each respective element in the plurality of elements; and generating graphene using the graphene initiating layer thereby forming the graphite-based structure.

20 Claims, 21 Drawing Sheets

(56) References Cited

OTHER PUBLICATIONS

Kim et al., "Transparent conductive graphene electrode in GaN-based ultra-violet light emitting diodes," Optics Express, vol. 18, No. 22, Oct. 25, 2010, 23030-23034.*
Hong et al., "Micropatterning of graphene sheets: recent advances in techniques and applications," J. Mater. Chem., 2012, 22, 8179.*
Sprinkle et al., "Scalable templated growth of graphene nanoribbons on SiC," Nature Nanotechnology, vol. 5, Oct. 2010, 727-731.*
Hu et al., "Structured epitaxial graphene: growth and properties," J. Phys. D: Appl. Phys., 45 (2012) 154010 (12 pp).*

\* cited by examiner

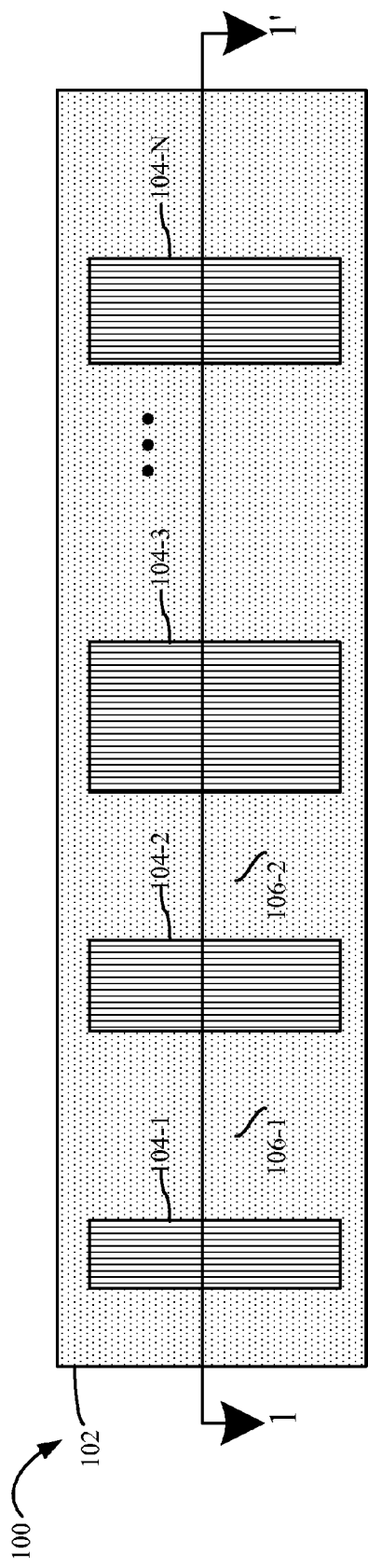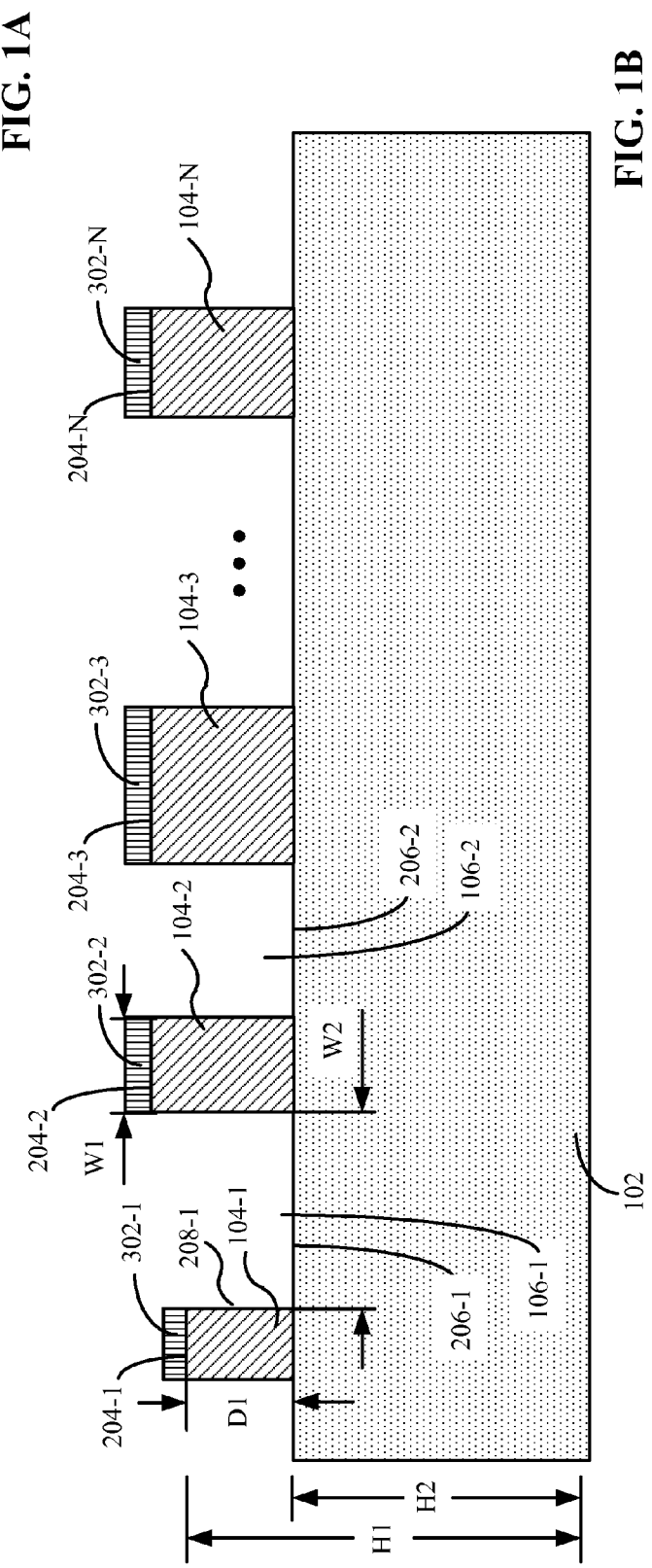

(1)
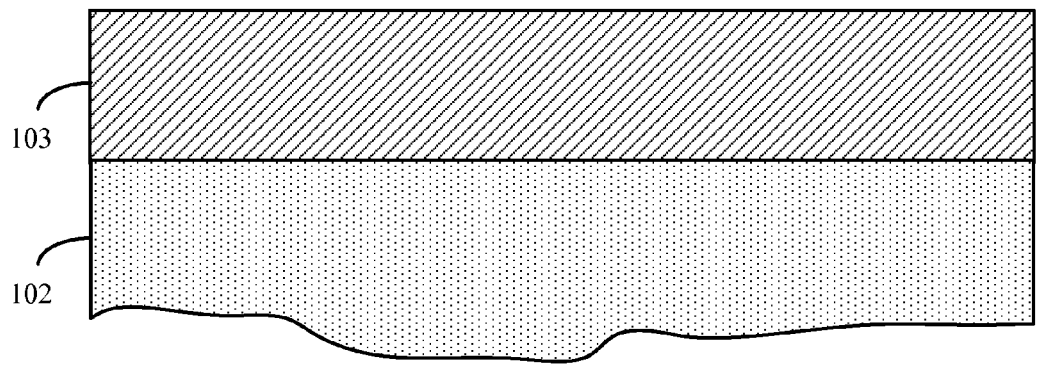
(2)
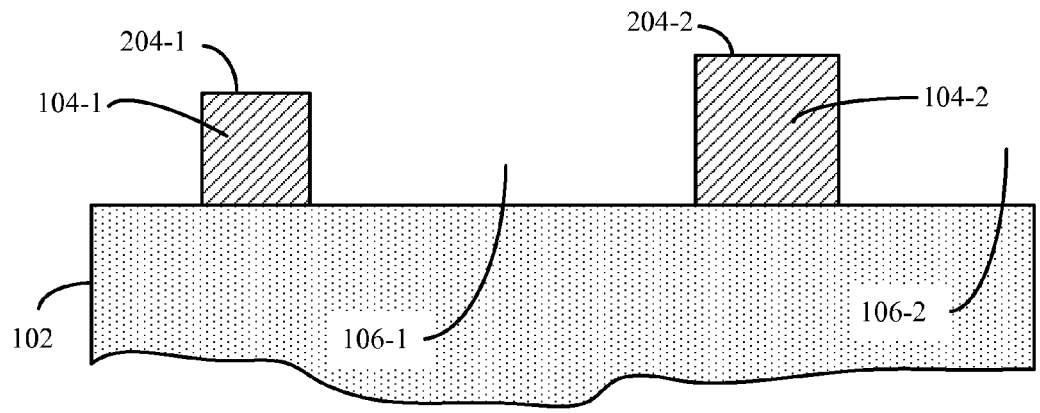
FIG. 5A

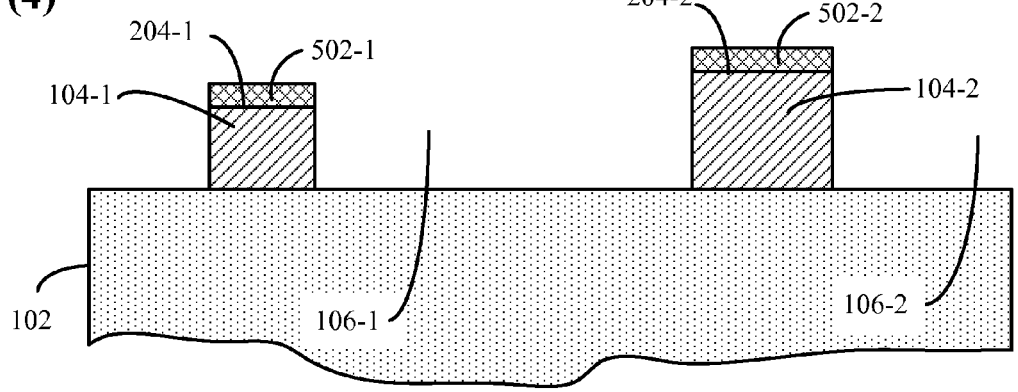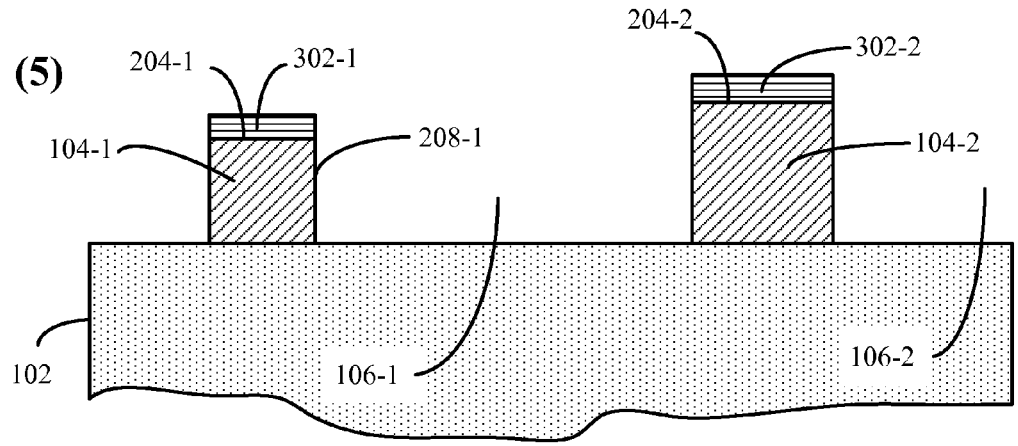
FIG. 6B

SEGMENTED GRAPHENE GROWTH ON SURFACES OF A PATTERNED SUBSTRATE LAYER AND DEVICES THEREOF

CROSS REFERENCE TO RELATED APPLICATION

This application claims priority to U.S. Provisional Patent Application No. 61/752,961, filed Jan. 15, 2013, entitled "Segmented Graphene Growth on Surfaces of a Patterned Substrate Layer and Devices Thereof," which is hereby incorporated by reference herein in its entirety.

TECHNICAL FIELD

The disclosed embodiments relate generally to methods for growth of graphene layers on patterned substrates and, more particularly, to methods for growth of segmented (e.g., disjoint or isolated) graphene layers on surfaces of a patterned substrate layer.

BACKGROUND

Graphene-based structures (such as graphene quantum dots, graphene nanoribbons, graphene nanonetworks, graphene plasmonics, and graphene super-lattices) exhibit chemical, mechanical, electronic, and optical properties that have applications and benefits in various electronic devices, composite materials, and implementations for energy generation and storage. Some graphene-based structures comprise one or more graphene films or one or more graphene layers that are in electrical communication with one another and/or with an external circuit.

Conventional methods to produce such graphene-based structures with one or more graphene layers include forming a continuous graphene film and then patterning (e.g., etching) the continuous graphene film to form isolated graphene layers or films. A disadvantage associated with this approach is that graphene is difficult to process chemically or mechanically—for example, it is difficult to control the etch-rate and etch-selectivity of graphene in relation to other materials used for device fabrication and processing.

Additionally, some methods of segmented graphene growth include oxidation of graphene from specific regions of the continuous graphene sheet to leave isolated graphene substantially in the unoxidized regions. A disadvantage of this oxidative approach to segmented graphene growth includes a loss of active graphene area due to sub-optimal spatial control of the oxidation reaction, thereby compromising the packing density of the segmented graphene layers.

Accordingly, there is a need for fabrication methods and graphene-based structures fabricated using these methods for reliably forming multiple segmented (e.g., isolated or disjoint) graphene layers.

SUMMARY

Disclosed are methods for segmented graphene growth that overcome the abovementioned limitations in conventional approaches to growing segmented graphene layers. The disclosed embodiments provide a method of fabricating graphene-based structures characterized by segmented (e.g., discontinuous or isolated) graphene layers by first patterning a substrate (or a substrate layer) to form device topology to define the underlying foundation of the graphene-based structure and graphene layers. Subsequently, the disclosed methods include selectively forming graphene-initiating material (such as catalytic metals; carbon compounds such as silicon carbide; or elemental silicon) in regions where isolated graphene-growth is desired. The segmented layers of graphene are then selectively generated using the graphene-initiating materials in regions of the topography where the graphene-initiating materials were selectively formed. The disclosed methods of forming, patterning, and isolating such graphene-initiating materials are better controlled and characterized than the methods of directly patterning graphene. This is because, in the instant methods, there is no absolute requirement that the graphene be patterned. As a result, the resulting fabrication processes allow for improved control in device fabrication, improved spatial resolution, and packing density of the segmented graphene layers.

Accordingly, in some embodiments, a method of forming a graphite-based structure on a substrate comprises patterning the substrate thereby forming a plurality of elements on the substrate. Each respective element in the plurality of elements is separated from an adjacent element on the substrate by a corresponding trench in a plurality of trenches on the substrate. Each respective element in the plurality of elements has a corresponding top surface. Each respective trench in the plurality of trenches is characterized by a trench surface. Each respective trench in the plurality of trenches separates a pair of adjacent elements in the plurality of elements. Each top surface of each respective element in the plurality of elements is separated from an adjacent trench surface by a side wall of the respective element. A top surface of a first element in the plurality of elements is characterized by a first elevation. A trench surface of a first trench in the plurality of trenches, the first trench separating the first element from another element in the plurality of elements, is characterized by a second elevation. This first elevation is other than the second elevation. A first orthogonal projection of the top surface of the first element and a second orthogonal projection of the trench surface of the first trench onto a common plane are contiguous or overlapping. The method further comprises segmentedly depositing a graphene initiating layer onto the top surface of one or more elements in the plurality of elements. The method also comprises generating graphene using the graphene initiating layer thereby forming the graphite-based structure.

Another aspect of the present disclosure provides an integrated graphite-based structure, comprising a substrate, with a plurality of elements and a plurality of trenches disposed on the substrate. Each respective element in the plurality of elements is separated from an adjacent element by a corresponding trench in the plurality of trenches. Each respective element in the plurality of elements has a top surface with a first side and an opposing second side, where a first portion of the top surface is on the first side and a second portion of the top surface is on the opposing second side. The integrated graphite-based structure further comprises a plurality of first graphene layers. Each respective first graphene layer in the plurality of first graphene layers is formed on the first portion of the top surface of a corresponding element in the plurality of elements. The integrated graphite-based structure further comprises a plurality of second graphene layers. Each respective second graphene layer formed on the second portion of the top surface of a corresponding element in the plurality of elements so that each respective element in the plurality of elements is separately overlayed by a first graphene layer in the plurality of first graphene layers and a second graphene layer in the plurality of second graphene layers.

In some embodiments, a first graphene layer in the plurality of first graphene layers on the first portion of the top surface of a first element in the plurality of elements has a width that is (i) between 10 nm and 300 nm or (ii) between 3 nm and 10 nm or (iii) less than 5 nm while a second graphene layer in the plurality of second graphene layers on the second portion of the top surface of the first element has a width that is (i) between 10 nm and 300 nm or (ii) between 3 nm and 10 nm, (iii) less than 5 nm.

In some embodiments, the graphite-based structure includes one or more diodes, one or more transistors, one or more LEDs, one or more photovoltaic cells, one or more photodetectors, or a combination thereof. In some embodiments, each respective first graphene layer in the plurality of first graphene layers comprises between 3 and 500 graphene sheets while each respective second graphene layer in the plurality of second graphene layers comprises between 3 and 500 graphene sheets.

In some embodiments, the substrate and the plurality of elements comprise a dielectric material.

In some embodiments, a first graphene layer in the plurality of first graphene layers is on the first portion of the top surface of a first element in the plurality of elements, a second graphene layer in the plurality of second graphene layers is on the second portion of the top surface of the first element, and the first graphene layer and the second graphene layer are separated by a meniscus.

In some embodiments, a first graphene layer in the plurality of first graphene layers is on the first portion of the top surface of a first element in the plurality of elements, a second graphene layer in the plurality of second graphene layers is on the second portion of the top surface of the first element, and the first graphene layer and the second graphene layer are electrically isolated from each other.

In some embodiments, a first graphene layer in the plurality of first graphene layers is on the first portion of the top surface of a first element in the plurality of elements, a second graphene layer in the plurality of second graphene layers is on the second portion of the top surface of the first element, and the first graphene layer and the second graphene layer are joined together to form a closed form shape (e.g., a circle, oval, or n-gon, wherein n is an integer of 3 or greater).

In some embodiments the first graphene layer and the second graphene layer on an element in the plurality of elements collectively define a meniscus. In some embodiments, each element in the plurality of elements is a rib, a mesa, or a pillar. In some embodiments, each element in the plurality of elements is a rib having a width that is between 1 nm and 10 nm, between 10 nm and 20 nm, between 20 nm and 30 nm, between 30 nm and 40 nm, between 50 nm and 100 nm, or between 100 nm and 500 nm. In some embodiments, each element in the plurality of elements is a mesa having a largest dimension that is between 10 nm and 100 nm, between 100 nm and 1 µm, or between 1 µm and 10 µm.

Another aspect of the present disclosure provides an integrated graphite-based structure, comprising a substrate, a plurality of elements and a plurality of trenches disposed on the substrate. Each respective element in the plurality of elements is separated from an adjacent element by a corresponding trench in the plurality of trenches. Furthermore, each element in the plurality of elements has a top surface with a set of P nonoverlapping portions, where P is a positive integer of two or greater (e.g., P=2, 3, 4, 5, 6, 7, 8, 9, 10, etc.) In some embodiments P is a multiple of 2. The integrated graphite-based structure further comprises a plurality of graphene layers. Each respective graphene layer in the plurality of graphene layers is formed on a corresponding portion of a corresponding top surface of a corresponding element in the plurality of elements so that each respective element in the plurality of elements is separately overlayed by N nonoverlapping graphene layers in the plurality of graphene layers.

In some embodiments, a first graphene layer in the plurality of graphene layers on a first portion of the top surface of a first element in the plurality of elements has a width that is (i) between 10 nm and 300 nm, (ii) between 3 nm and 10 nm, or (iii) less than 5 nm. Moreover, a second graphene layer in the plurality of graphene layers on a second portion of the top surface of the first element has a width that is (i) between 10 nm and 300 nm, (ii) between 3 nm and 10 nm, or (iii) less than 5 nm.

In some embodiments, the graphite-based structure includes one or more diodes, one or more transistors, one or more LEDs, one or more photovoltaic cells, one or more photodetectors, or a combination thereof. In some embodiments, each respective graphene layer in the plurality of graphene layers comprises between 3 and 500 graphene sheets. In some embodiments, the substrate and the plurality of elements comprise a dielectric material.

In some embodiments a first graphene layer in the plurality of graphene layers is on the first portion of the top surface of a first element in the plurality of elements and a second graphene layer in the plurality of graphene layers is on the second portion of the top surface of the first element and the first graphene layer and the second graphene layer are separated by a meniscus.

In some embodiments, a first graphene layer in the plurality of graphene layers is on a first portion of the top surface of a first element in the plurality of elements while a second graphene layer in the plurality of graphene layers is on a second portion of the top surface of the first element, and the and second graphene layers are electrically isolated from each other.

In some embodiments, the respective graphene layers in the plurality of graphene layers on a top surface of a first element in the plurality of elements are joined together to form a closed form shape (e.g., a circle, oval, or n-gon, wherein n is a positive integer of 3 or greater).

In some embodiments, the respective graphene layers in the plurality of graphene layers on a top surface of a first element in the plurality of elements collectively define a meniscus. In some embodiments, each element in the plurality of elements is a rib, a mesa, or a pillar. In some embodiments, each element in the plurality of elements is a rib having a width that is between 1 nm and 10 nm, between 10 nm and 20 nm, between 20 nm and 30 nm, between 30 nm and 40 nm, between 50 nm and 100 nm, between 100 nm and 500 nm, between 10 nm and 100 nm, or between 100 nm and 1 µm. In some embodiments, each element in the plurality of elements is a mesa having a largest dimension that is between 1 µm and 10 µm.

BRIEF DESCRIPTION OF THE DRAWINGS

FIG. 1A illustrates a top view of an exemplary graphene device topography fabricated by exemplary methods in accordance with an embodiment of the present disclosure.

FIG. 1B illustrates a cross-sectional view of the exemplary graphene device topography taken along line 1-1' of FIG. 1A and fabricated by an exemplary method in accordance with an embodiment of the present disclosure.

FIGS. 5A-5B and FIGS. 5C-5D include flow diagrams illustrating processes for fabricating graphene device topography by exemplary methods (e.g., using a silicon carbide based graphene initiating layer) in accordance with an embodiment of the present disclosure.

FIGS. 6A-6B and FIGS. 6C-6D include flow diagrams illustrating processes for fabricating graphene device topography by exemplary methods (e.g., using a silicon based graphene initiating layer) in accordance with an embodiment of the present disclosure.

Like reference numerals refer to corresponding parts throughout the drawings.

DESCRIPTION OF EMBODIMENTS

Figure 2A:
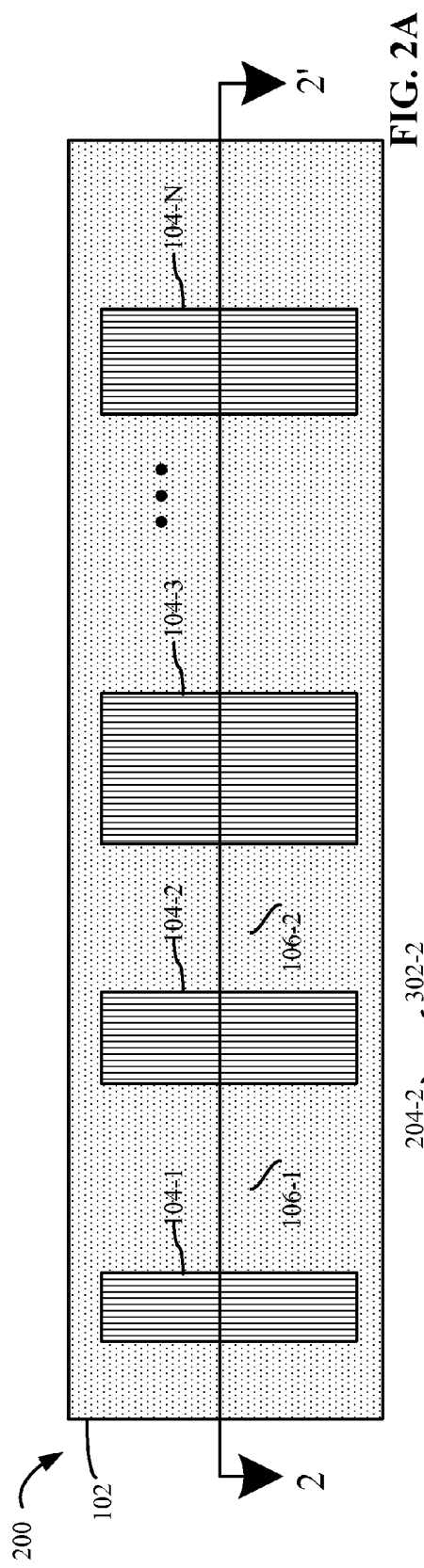
FIG. 2A illustrates a top view of an exemplary graphene device topography fabricated by exemplary methods in accordance with an embodiment of the present disclosure.

It will be understood that, although the terms "first," "second," etc. are optionally used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

As used herein, the term "substrate" refers to a solid substance generally in a form of a thin slice. The substrate can be planar or flexible, and can comprise dielectric, semiconducting or metallic materials, such as glass, Si, $SiO_2$, SiC, Cu, Ni, or other materials. In some embodiments, the substrate is made of poly methyl methacrylate (PMMA), polyethylene terephthalate (PET), polyvinyl alcohol (PVA), or cellulose acetate (CA). Exemplary dielectric materials that can be used for substrates include, but are not limited to, glass, silicon dioxide, neoceram, and sapphire. Exemplary semiconducting materials that can be used for substrates include, but are not limited to, silicon (Si), silicon carbide (SiC), germanium (Ge), boron nitride (BN), and molybdenum sulfide (MoS).

Exemplary metallic materials comprise copper (Cu), nickel (Ni), platinum (Pt), gold (Au), cobalt (Co), ruthenium (Ru), palladium (Pd), titanium (Ti), silver (Ag), aluminum (Al), cadmium (Cd), iridium (Ir), combinations thereof, and alloys thereof. In some embodiments the substrate comprises a metal foil or a metal slug. In some embodiments the substrate comprises Si, $SiO_2$, SiC, Cu, Ni, or other materials. In some embodiments, the substrate substantially comprises neoceram, barosilicate glass, germanium arsenide, a IV-V semiconductor material, a substantially metallic material, a high temperature glass, or a combination thereof.

In some embodiments, the substrate is made of glass. Any of a wide variety of glasses can be used to make the substrate, some of which are described here. In some embodiments, the substrate is made of silicon dioxide ($SiO_2$) glass. In some embodiments, the substrate is made of soda lime glass formed from silicon dioxide, soda (e.g., sodium carbonate $Na_2CO_3$), or potash, a potassium compound, and lime (calcium oxide, CaO). In some embodiments, the substrate is made of lead glass, such as lead crystal or flint glass. In some embodiments, silicon dioxide glass doped with boron, barium, thorium oxide, lanthanum oxide, iron, or cerium(IV) oxide is used to make the substrate. In some embodiments, the substrate is made of aluminosilicate, borosilicate (e.g., PYREX®, DURAN®, SIMAX®), dichroic, germanium/semiconductor, glass ceramic, silicate/fused silica, soda lime, quartz, or chalcogenide/sulphide. In some embodiments, the substrate is made of poly methyl methacrylate (PMMA), polyethylene terephthalate (PET), polyvinyl alcohol (PVA), or cellulose acetate (CA). In some embodiments, the substrate is made of a urethane polymer, an acrylic polymer, a fluoropolymer, polybenzamidazole, polymide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadiene-styrene, polytetra-fluoro-ethylene, polymethacrylate, nylon 6,6, cellulose acetate butyrate, cellulose acetate, rigid vinyl, plasticized vinyl, or polypropylene. In some embodiments, the substrate includes one layer. In alternative embodiments, the substrate includes a plurality of layers. In some embodiments, a substrate comprises a plurality of layers, each with a different material. In some embodiments, a layer of another substance is applied onto the substrate. In some embodiments, the substrate has crystallographic symmetry. In some embodiments the substrate is crystalline (e.g., mono-crystalline or polycrystalline).

As used herein, the term "sheet" refers to a substantially two-dimensional or one-atom thick substance. For example, a "graphene sheet" refers to one-atom-thick substance with carbon atoms arranged in a hexagonal lattice. A "graphene sheet" also refers to a carbon-based sheet which comprises additional materials such as boron, oxides, dopants and/or edge atomic substitutes.

As used herein, the term "graphene layer" or "graphite layer" refers to one or more graphene sheets (e.g., one, a few, several, several tens, several hundreds or several thousands of graphene sheets). The thickness of a graphene layer can therefore range between a nanometer to several micrometers, or to several tens of micrometers depending upon the number of graphene sheets in the graphene layer. Final graphene layers produced by the processes disclosed in this application can have a thickness in nanometers, and preferably less than fifty nanometers. The terms "graphene layer" and "graphite layer" are interchangeable in the present disclosure.

As used herein, the term "trench" refers to a space that separates two adjacent elements. It can be a recess formed in the substrate such as by etching, a space on or above the substrate formed for example by depositing two adjacent elements on or above the substrate, or a combination thereof. A trench can be of any shape or size as long as it separates two adjacent elements. In some embodiments, it is deep and/or has a width that is smaller than a characteristic length.

Reference will now be made in detail to various embodiments, examples of which are illustrated in the accompanying drawings. In the following detailed description, numerous specific details are set forth in order to provide a thorough understanding of the invention and the described embodiments. However, the invention may be practiced without these specific details. In other instances, well-known methods, procedures, components, and circuits have not been described in detail so as not to unnecessarily obscure aspects of the embodiments.

FIG. 1A illustrates a top view of an exemplary graphene device topography 100 fabricated by exemplary methods in accordance with an embodiment of the present disclosure. FIG. 1B illustrates a cross-sectional view of the exemplary graphene device topography 100 taken along line 1-1' of FIG. 1A. In some embodiments, the graphite-based structure and graphene device topography comprises a structure having at least one graphene layer on at least one surface of the structure. The terms "graphite-based structure" and "graphene device topography" are interchangeable in the present disclosure.

As shown in FIGS. 1A-1B, patterned substrate 102 includes a plurality of elements 104 (e.g., elements 104-1, 104-2, 104-n and the like) on substrate 102. Each respective element in the plurality of elements 104 is separated from an adjacent element on substrate 102 by a corresponding trench (e.g., trench 106-1, 106-2, and the like) in a plurality of trenches 106 on substrate 102.

In some embodiments, a substrate is a solid substance in a form of a thin slice. The substrate can be planar or flexible. In some embodiments, the substrate includes one layer. In alternative embodiments, the substrate includes a plurality of layers. In some embodiments, a substrate comprises a plurality of layers, each with a different material. In some embodiments, a layer of another substance is applied onto the substrate. In some embodiments, the substrate has crystallographic symmetry.

In some embodiments, an element is a feature configured or generated on a substrate. In general, at least a portion of the element is on or above the substrate. In some embodiments, a trench is a recess formed in the substrate such as by etching, a space on or above the substrate formed for example by depositing two adjacent elements on or above the substrate, or a combination thereof. Exemplary elements include ribs, ribbons, pillars, mesas, geometries that produce or promote plasmonic effects or other configurations. "Rib" or "ribbon" herein refers to a feature having a width that is less than the length. In some embodiments, "rib" and "ribbon" are interchangeable. "Pillar" herein refers to substantially circular, ovoid, regular or irregular features. "Mesa" herein refers to an island isolated from other features on the substrate or a plateau on the substrate. In general, a mesa has at least one dimension that is relatively large and thus can be used as a base for further processing of more complex structures. In some embodiments, a mesa has a topographical height feature, providing a capability for vertical isolation and/or size for desired functionality.

As shown in FIG. 1B, each respective element (e.g., element 104-1, element 104-2, and the like) in the plurality of elements 104 has a corresponding top surface (e.g., top surface 204-1, 204-2 and the like). Each respective trench (e.g., trench 106-1, 106-2, and the like) in the plurality of trenches 106 is characterized by a trench surface (e.g., trench surfaces 206-1, 206-2 and the like). Each respective trench in the plurality of trenches 106 separates a pair of adjacent elements in the plurality of elements 104. For example, trench 106-1 separates a pair of adjacent elements 104-1 and 104-2. Each top surface of each respective element in the plurality of elements 104 is separated from an adjacent trench surface by a side wall of the respective element. For example, top surface 204-1 of element 104-1 is separated from trench surface 206-1 by side wall 208-1 of the respective element.

A top surface of a first element in the plurality of elements is characterized by a first elevation. A trench surface of a first trench in the plurality of trenches is characterized by a second elevation. The first trench separates the first element from another element in the plurality of elements. The first elevation is other than the second elevation. For example, as shown in FIG. 1B, top surface 204-1 of element 104-1 is characterized by first elevation H1 and trench surface 206-1 of trench 106-1 is characterized by second elevation H2, where H1 is distinct from H2. A first orthogonal projection of the top surface of the first element and a second orthogonal projection of the trench surface of the first trench onto a common plane are contiguous or overlapping. A first orthogonal projection of the top surface of the first element and a second orthogonal projection of the trench surface of the first trench onto a common plane are contiguous or overlapping. In some embodiments, the first orthogonal projection of the top surface of the first element on the common plane has a first width and the second orthogonal projection of the trench surface of the first trench on the common plane has a second width. In some embodiments, the first width is in a range that is between 5 nm and 120 nm, between 8 nm and 90 nm, between 5 nm and 40 nm, or between 5 nm and 30 nm. The second width is in a range that is between 5 nm and 500 nm, between 3 nm and 300 nm, between 10 nm and 100 nm, or between 5 nm and 40 nm.

It will be understood that a fair amount of process variation occurs in the dimensions (e.g., width, height, elevation, etc.) of the features described herein and thus, to a certain extent, dimensions disclosed herein necessarily represent a characteristic or average dimension, taking into account this process variation.

In some embodiments, an "orthogonal projection onto a common plane" comprises a projection of an image of a surface onto a plane without enlarging the image. Stated differently, the dimensions of the contours of the surface, when projected onto a common plane exactly match the actual dimensions of the surface that is projected. The construct of "orthogonal projection onto a common plane" has utility when two or more surfaces, which may be spatially separated on a z-axis, are projected along the z-axis onto a common plane. Such a projection is useful for illustrating whether the two projected surfaces are contiguous or overlapping.

In some embodiments, the top surface of the first element and the trench surface of the first trench are separated by a first side wall of the first element (e.g., side wall 208-1 of element 104-1). The first side wall has a first height (e.g., as shown in FIG. 1B, side wall 208-1 has a first height D1) in a direction substantially perpendicular to the common plane, wherein the first height is between 10 nm and 2 µm, between 15 nm and 1 µm, or between 10 nm and 500 nm.

FIGS. 1A-1B further illustrate a graphite-based structure 100 formed by generating graphene on the top surface 204 of each respective element in the plurality of elements 104. In some embodiments, generating graphene includes generating a respective graphene layer (e.g., graphene layers 302-1, 302-2, 302-3, and the like) on the top surface of each respective element of the plurality of elements 104. As shown in FIGS. 1A-1B, the generated graphene layers 302 (e.g., including graphene layer 302-1 on the top surface 204-1 of element 104-1, graphene layer 302-2 on the top surface 204-2 of element 104-2, and the like) are segmented (e.g., disjoint, discontinuous, non-overlapping or isolated from one another).

In some embodiments, the respective graphene layer comprises about 1 to 300 graphene sheets. In some embodiments, the graphene layer comprises 1 graphene sheet. In various embodiments, the graphene layer comprises between 2 and 10 graphene sheets, between 10 and 30 graphene sheets, between 25 and 50 graphene sheets, between 50 and 100 graphene sheets, or over 100 graphene sheets. In some embodiments, the graphene layer has a thickness that is between 1 to 100 nm. In some embodiments, a sheet is a substantially two-dimensional or one-atom thick substance. In some embodiments, a graphene sheet is a one-atom-thick substance with carbon atoms arranged in a hexagonal lattice. In some embodiments, a graphene sheet is a carbon-based sheet which comprises additional materials such as boron, oxides, dopants and/or edge atomic substitutes.

Figure 2B:
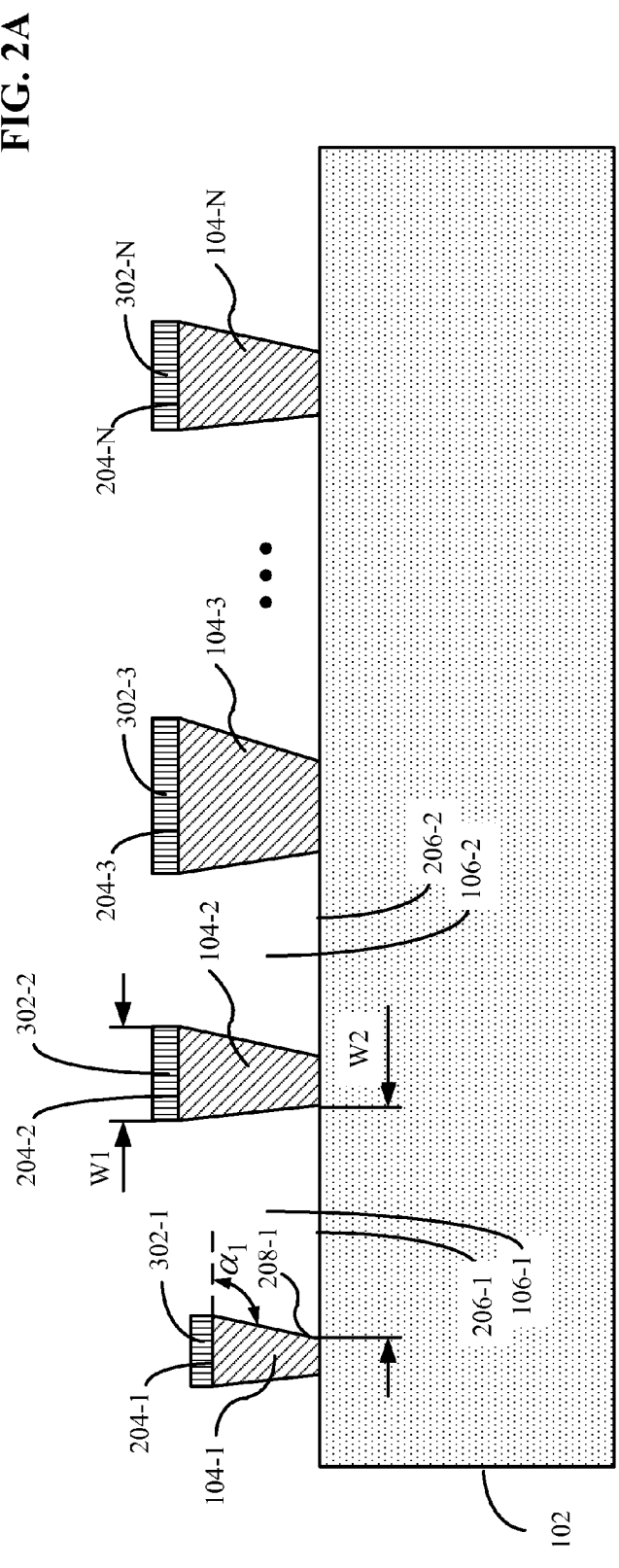
FIG. 2B illustrates a cross-sectional view of the exemplary graphene device topography taken along line 2-2' of FIG. 2A and fabricated by an exemplary method in accordance with an embodiment of the present disclosure.

FIG. 2A shows a top view of an exemplary graphene device topography 200 fabricated by exemplary methods in accordance with an embodiment of the present disclosure. FIG. 2B illustrates a cross-sectional view of the exemplary graphene device topography 200 taken along line 2-2' of FIG. 2A and fabricated by an exemplary method in accordance with an embodiment of the present disclosure.

In some embodiments, as shown in FIG. 2B, the top surface of the first element (e.g., top surface 204-1 of element 104-1, FIG. 2B) and the trench surface of the first trench (e.g., trench surface 206-1 of trench 106-1, FIG. 2B) are separated by a first side wall of the first element (e.g., side wall 208-1 of element 104-1, FIG. 2B). In some embodiments, the patterning causes the first side wall of the first element (e.g., side wall 208-1 of element 104-1) to have an obtuse entry angle (e.g., angle $\alpha_1$, FIG. 2B) with respect to the top surface of the first element (e.g., with respect to top surface 204-1 of element 104-1, FIG. 2B), thereby causing the combination of the top surface and the trench surface to have a surface area that is greater than a surface area of the corresponding portion of the substrate prior to patterning.

FIGS. 2A-2B further illustrate a graphite-based structure 200 formed by generating graphene on the top surface 204 of each respective element in the plurality of elements 104. In some embodiments, generating graphene includes generating a respective graphene layer (e.g., graphene layers 302-1, 302-2, 302-3, and the like) on the top surface of each respective element of the plurality of elements 104. As shown in FIGS. 2A-2B, the generated graphene layers 302 (e.g., including graphene layer 302-1 on the top surface 204-1 of element 104-1, graphene layer 302-2 on the top surface 204-2 of element 104-2, and the like) are segmented (e.g., disjoint, discontinuous, non-overlapping or isolated from one another).

Figure 3:
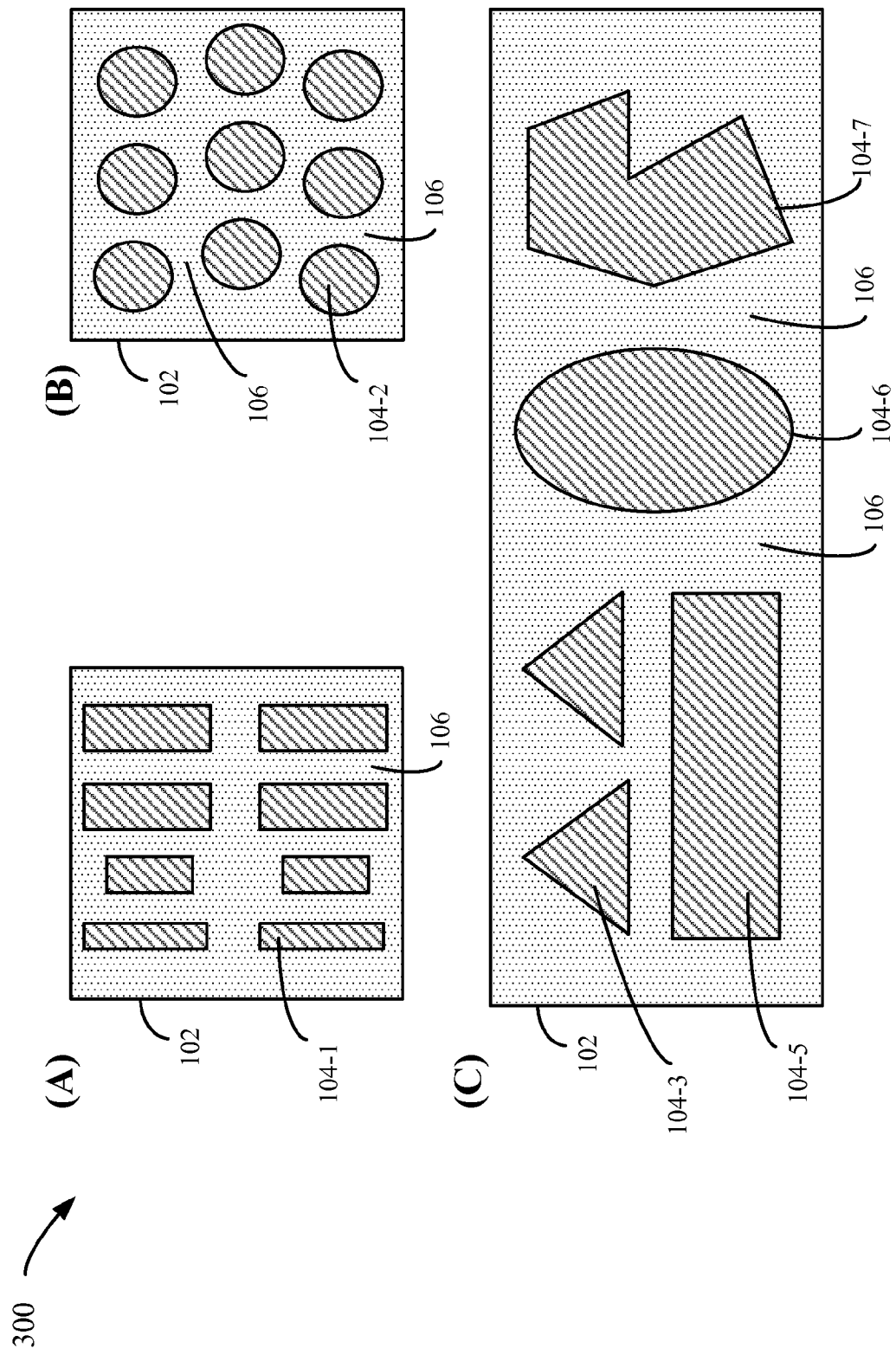
FIGS. 3A-3C illustrate top views of exemplary graphene device topographies fabricated by exemplary methods in accordance with embodiments of the present disclosure.

FIGS. 3A-3C illustrate top views of exemplary graphene device topographies fabricated by exemplary methods in accordance with embodiments of the present disclosure.

Continuing to refer to FIGS. 3A-3C, in some embodiments, the first element in the plurality of elements 104 is a rib. In some embodiments, an orthogonal projection of the rib on the common plane has a length and a width, where the length is at least two times the width. In some embodiments, a projection of the rib on the common plane has a length and a width, where the length is between two times and five times the width. For example, the elements 104 (e.g., element 104-1) shown in FIG. 3A are ribs and a projection of the rib on the common plane has a length and a width, where the length is at least two times the width.

In various embodiments, an orthogonal projection of the rib on the common plane has a width that is between 1 nm and 10 nm, between 10 nm and 20 nm, between 20 nm and 30 nm, between 30 nm and 40 nm, between 50 nm and 100 nm, or between 100 nm and 500 nm. In some embodiments, an orthogonal projection of each rib in a plurality of ribs on the common plane has a width within the common plane that is on the order of nanometers in width, and where the width of the projection of each rib within the common plane does not deviate from the width of any other rib in the plurality of ribs within the common plane by more than 0.1 nm, by more than 0.2 nm, by more than 0.3 nm, by more than 0.4 nm, by more than 0.5 nm, by more than 0.6 nm, by more than 0.7 nm, by more than 0.8 nm, by more than 0.9 nm, by more than 1 nm, by more than 2 nm, by more than 3 nm, by more than 4 nm, or by more than 5 nm.

In some embodiments, a first element in the plurality of elements 104 is a mesa. In some embodiments, a mesa is an island isolated from other features on the substrate or a plateau on the substrate. In some embodiments, a mesa has at least one dimension that is relatively large and thus can be used as a basis for further processing of more complex structures. In some embodiments, a mesa has a topographical height feature, providing a capability for vertical isolation and/or size for desired functionality. In some embodiments, an orthogonal projection of the mesa on the common plane has a size in any dimension in the common plane that is between 10 nm and 100 nm, between 100 nm and 1 µm, or between 1 µm and 10 µm. In some embodiments, an orthogonal projection of each mesa in a plurality of mesa on the common plane has a largest dimension within the common plane that is on the order of nanometers, where this characteristic dimension of the projection the mesa does not deviate from the characteristic dimension, within the common plane projected by any other mesa in a plurality of mesas, by more than 0.1 nm, by more than 0.2 nm, by more than 0.3 nm, by more than 0.4 nm, by more than 0.5 nm, by more than 0.6 nm, by more than 0.7 nm, by more than 0.8 nm, by more than 0.9 nm, by more than 1 nm, by more than 2 nm, by more than 3 nm, by more than 4 nm, or by more than 5 nm.

In some embodiments, the first element in the plurality of elements 104 is a pillar. In some embodiments, an orthogonal projection of the pillar (e.g., pillar 104-2, FIG. 3B) on the common plane is substantially circular. In some embodiments, an orthogonal projection of the pillar (e.g., pillar 104-6, FIG. 3C) on the common plane is substantially ovoid. In some embodiments, an orthogonal projection of the pillar (e.g., pillar 104-3 or pillar 104-7, FIG. 3C) on the common plane is substantially polygonal. In some embodiments, the elements 104 have holes within them.

Figure 4A:
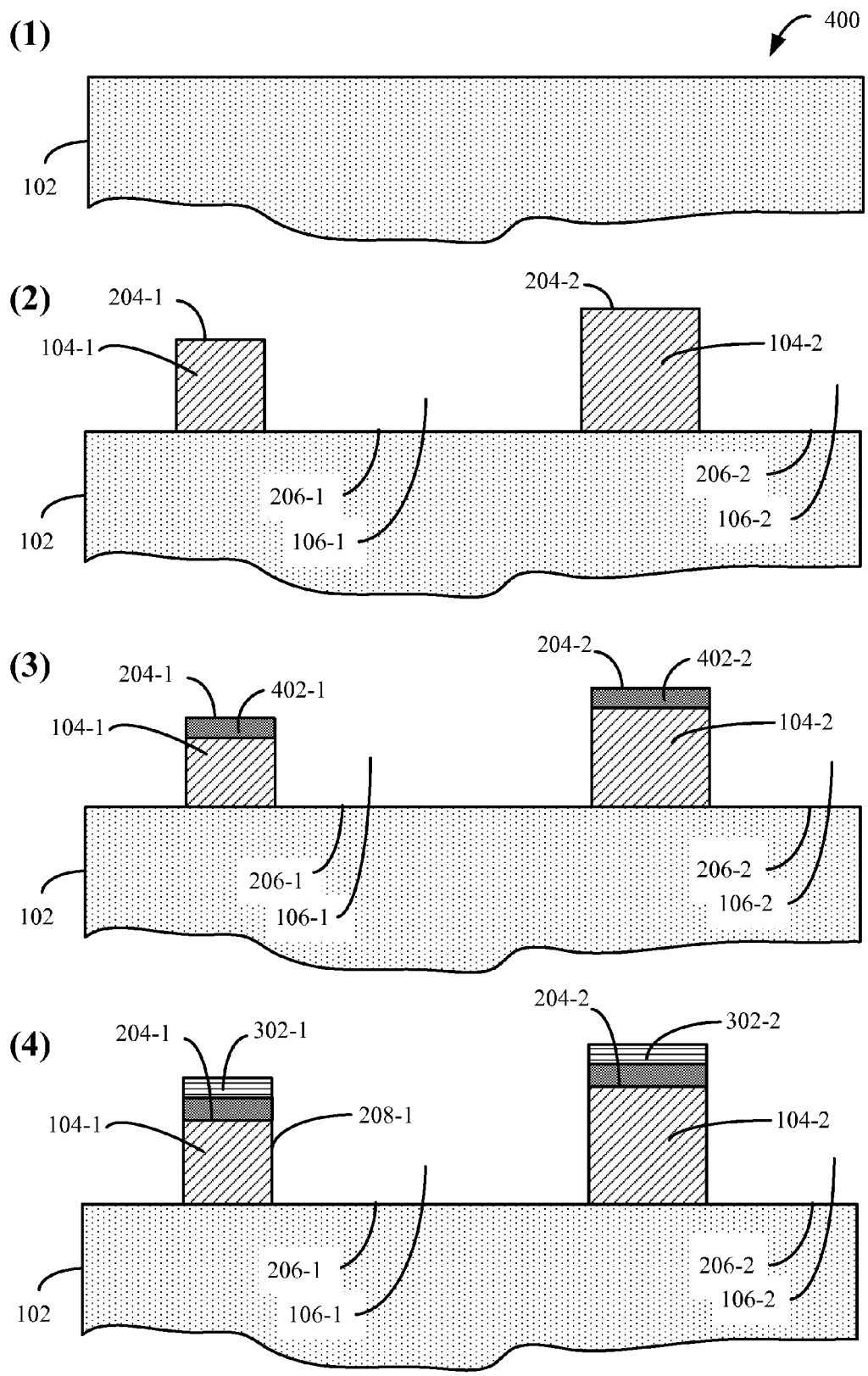
FIG. 4A and FIGS. 4B-4C include flow diagrams illustrating processes for fabricating graphene device topography by exemplary methods (e.g., using a metal based graphene initiating layer) in accordance with an embodiment of the present disclosure.
Figure 4B:
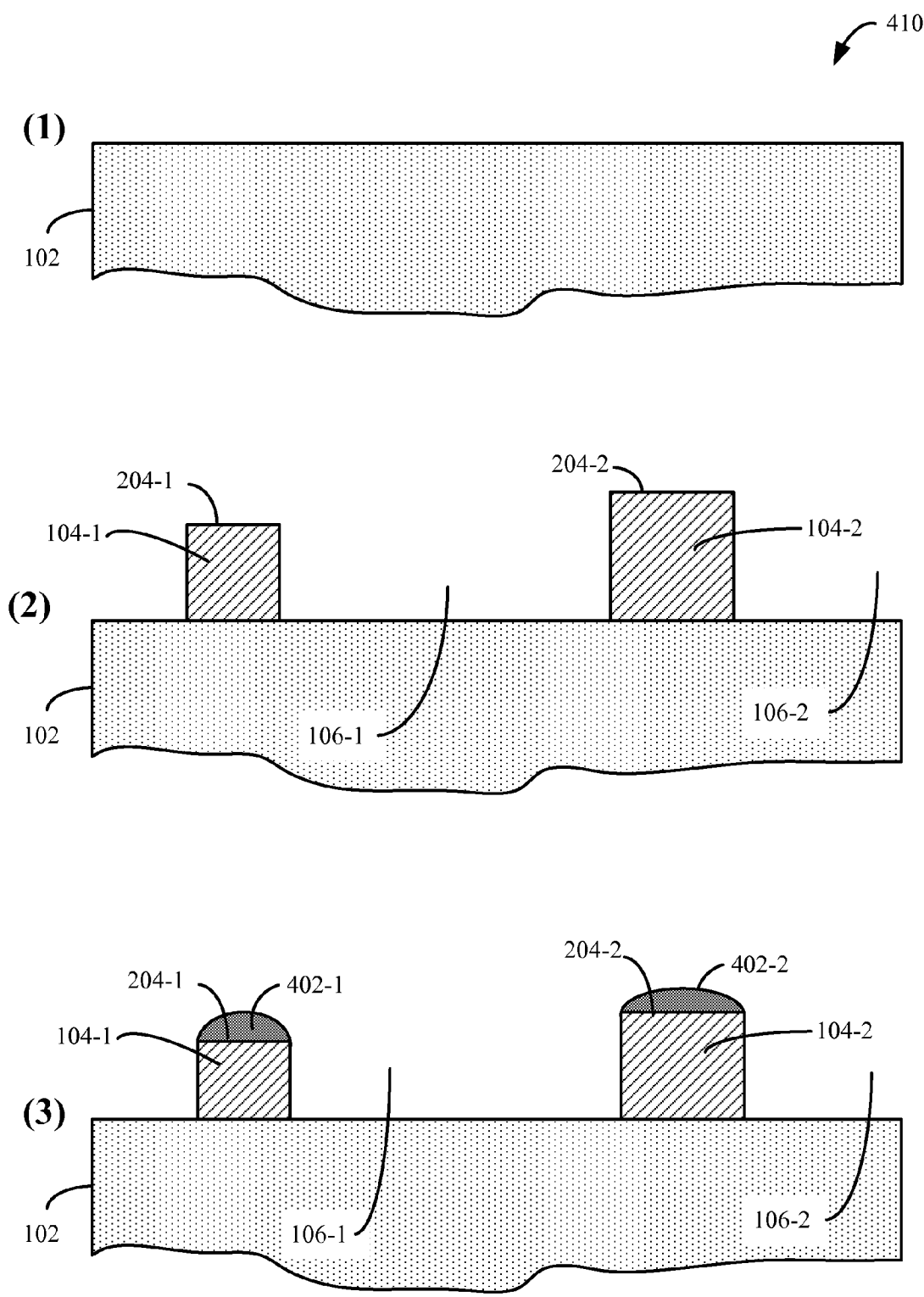
Figure 4C:
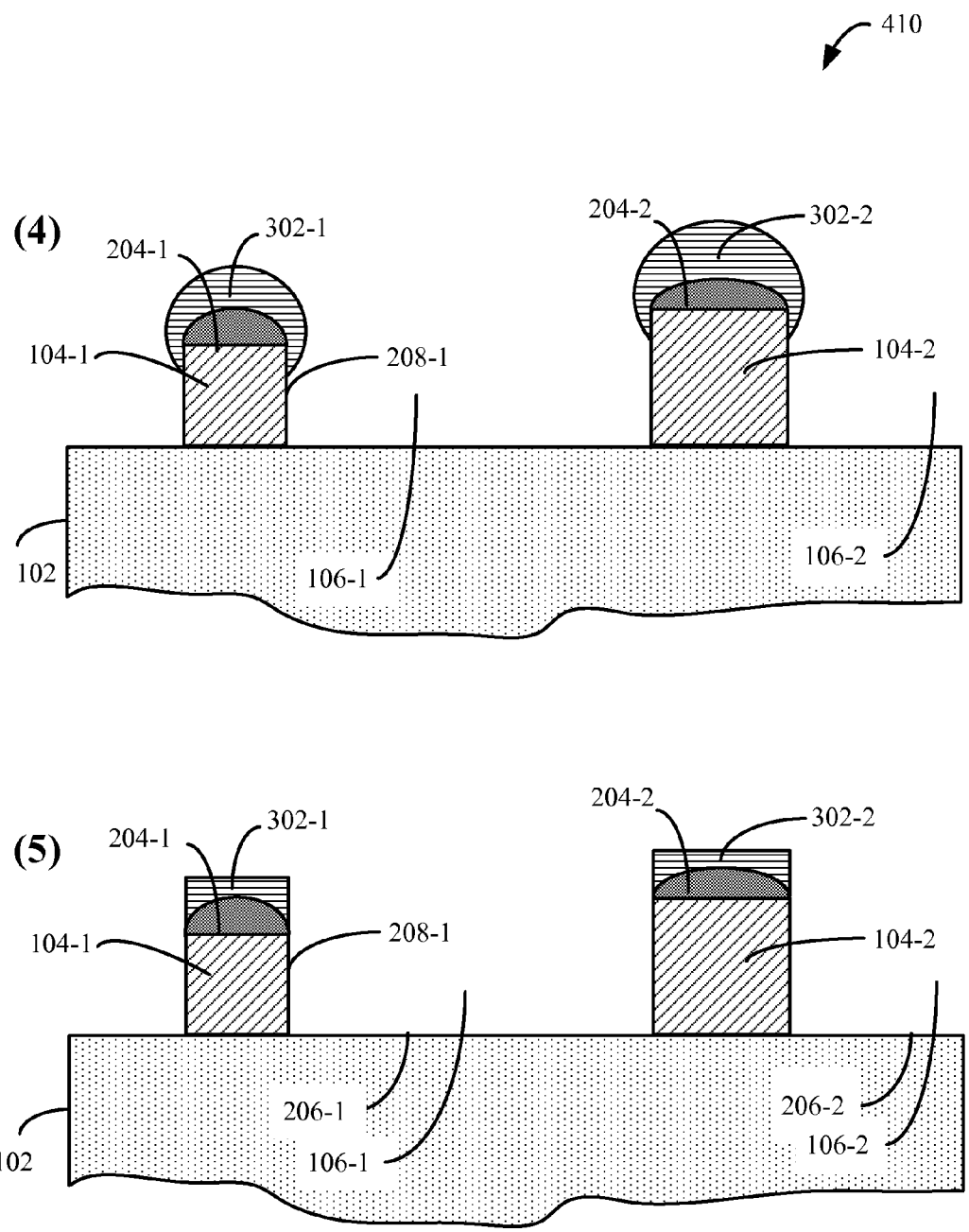

FIG. 4A and FIGS. 4B-4C include flow diagrams illustrating processes 400 and 410, respectively, for fabricating graphene device topography by exemplary methods (e.g., using a metal based graphene initiating layer) in accordance with an embodiment of the present disclosure.

Shown in step 400-1 is a substrate 102 comprising a substrate material. In some embodiments, the substrate substantially comprises neoceram, barosilicate glass, germanium arsenide, a IV-V semiconductor material, a substantially metallic material, a high temperature glass, or a combination thereof. In some embodiments, the substrate substantially comprises $SiO_2$ glass, soda lime glass, lead glass, doped $SiO_2$, aluminosilicate glass, borosilicate glass, dichroic glass, germanium/semiconductor glass, glass ceramic, silicate/fused silica, quartz or chalcogenide/sulphide glass. In some embodiments, the substrate substantially comprises any of the materials disclosed for substrates herein.

As shown in step 400-2, in some embodiments substrate 102 is patterned to form a plurality of elements 104 (e.g., elements 104-1 and 104-2). Each respective element in the plurality of elements 104 is separated from an adjacent element on the substrate 102 by a corresponding trench (e.g., trench 106-1, 106-2, and the like) in a plurality of trenches 106 on substrate 102. In some embodiments, the plurality of elements 104 is formed by growing portions of substrate material selectively at regions of the substrate corresponding to the plurality of elements. Alternatively, or in addition, as shown in step 400-2, the plurality of elements is formed by growing at least one respective secondary material, distinct from a substrate material, selectively on regions of the substrate corresponding to the plurality of elements.

In other words, in some embodiments, the plurality of elements 104 comprises substantially the same material as substrate 102. In alternative embodiments, the plurality of elements 104 comprises a respective secondary material, distinct from the substrate material. In some embodiments, the respective secondary material comprises one or more of: a dielectric material, a metal oxide, a metal nitride, a semi-conductor material, a metal, or a combination thereof.

Further, as shown in step 400-3, a graphene initiating layer (e.g., graphene initiating layer 402, including segmented graphene initiating layers 402-1 and 402-2) is segmentedly deposited onto the top surface (e.g., top surface 204-1, 204-2) of each respective element in the plurality of elements 104. In some embodiments, the graphene initiating layer substantially comprises an elemental metal selected from the group consisting of: platinum, gold, palladium, ruthenium, aluminum, titanium, tungsten, cadmium, copper, nickel, nickel foam, iron, or a combination thereof. In some embodiments, the metal graphene initiating layer is sputter-deposited onto the top surface 204 of each respective element in the plurality of elements 104. In some embodiments, as shown in step 400-3, the deposited graphene initiating layer (e.g., graphene initiating layer 402, including segmented metal graphene initiating layers 402-1 and 402-2) has a substantially planar profile or substantially planar top surface.

Further, as shown in step 400-4, a graphite-based structure is formed by generating graphene using the graphene initiating layer (e.g., segmented metal graphene initiating layers 402-1 and 402-2). In some embodiments, graphene is generated using the graphene initiating layer 402 by growing a carbon material on the graphene initiating layer thereby forming the graphite-based structure. In some embodiments, the carbon material is deposited on the graphene initiating layer and the deposited carbon material is heated thereby forming the graphite-based structure. In some embodiments, as shown in step 400-4, the graphene layer 302 generated using the graphene initiating layer 402 has a substantially planar profile or substantially planar top surface.

In alternative embodiments, as shown in process 410 (e.g., step 410-3) in FIGS. 4B-4C, the deposited graphene initiating layer 402 (e.g., graphene initiating layer 402, including segmented metal graphene initiating layers 402-1 and 402-2) has a substantially arcuate profile or substantially arcuate top surface, comprising a meniscus that covers the top surface (e.g., top surface 204-1, 204-2) of one or more elements in the plurality of elements 104. Alternatively, or in addition, as shown in process 410 (e.g., step 410-4) in FIG. 4C the graphene layer 302 generated using the graphene initiating layer 402 has a substantially arcuate profile or substantially arcuate top surface. In such embodiments, as shown in step 410-5, a portion of the graphene 302 generated on each respective element (e.g., graphene layer 302-1, 302-2) is isotropically etched so as to define a profile of the side wall (e.g., a substantially planar side wall) of the respective element.

FIGS. 5A-5B and FIGS. 5C-5D include flow diagrams illustrating processes 500 and 510, respectively, for fabricating graphene device topography by exemplary methods (e.g., using a silicon carbide based graphene initiating layer) in accordance with an embodiment of the present disclosure.

In some embodiments, as shown in step 500-1 of FIG. 5A, a substrate comprises a plurality of layers. In some embodiments, the plurality of layers includes at least one respective substrate layer and the substrate comprises a plurality of materials, including a respective material of the respective substrate layer (e.g., the substrate includes a respective substrate layer 103 comprising a first respective material and a substrate layer 102 comprising a second substrate material).

As shown in step 500-2, the substrate (e.g., comprising respective substrate layer 103) is patterned to form a plurality of elements 104 (e.g., elements 104-1 and 104-2), each respective element in the plurality of elements 104 is separated from an adjacent element on the substrate by a corresponding trench (e.g., trench 106-1, 106-2, and the like) in a plurality of trenches 106 on the substrate. In some embodiments, the plurality of trenches 106 are formed by removing portions of the respective material from predefined regions of respective substrate layer 103. In some embodiments, the respective material is removed from predefined regions of the respective substrate layer by etching the plurality of trenches into the respective substrate layer 103. In some embodiments, respective substrate layer 103 comprises a photoresist material and portions of the respective material (e.g., photoresist material) are removed from predefined regions of respective substrate layer 103 using photolithography.

In alternative embodiments, the substrate comprises a single layer (e.g., made of a substrate material). In such embodiments, the plurality of trenches is formed by removing portions of substrate material from predefined regions of the substrate. In some embodiments, portions of the substrate material are removed by etching the plurality of trenches into the substrate. In some embodiments, the plurality of trenches are etched into the substrate or into respective substrate layer 103 by photolithography, x-ray lithography, reactive ion-etching, plasma etching, sputter etching, e-beam direct writing, or a combination thereof.

Figure 5B:
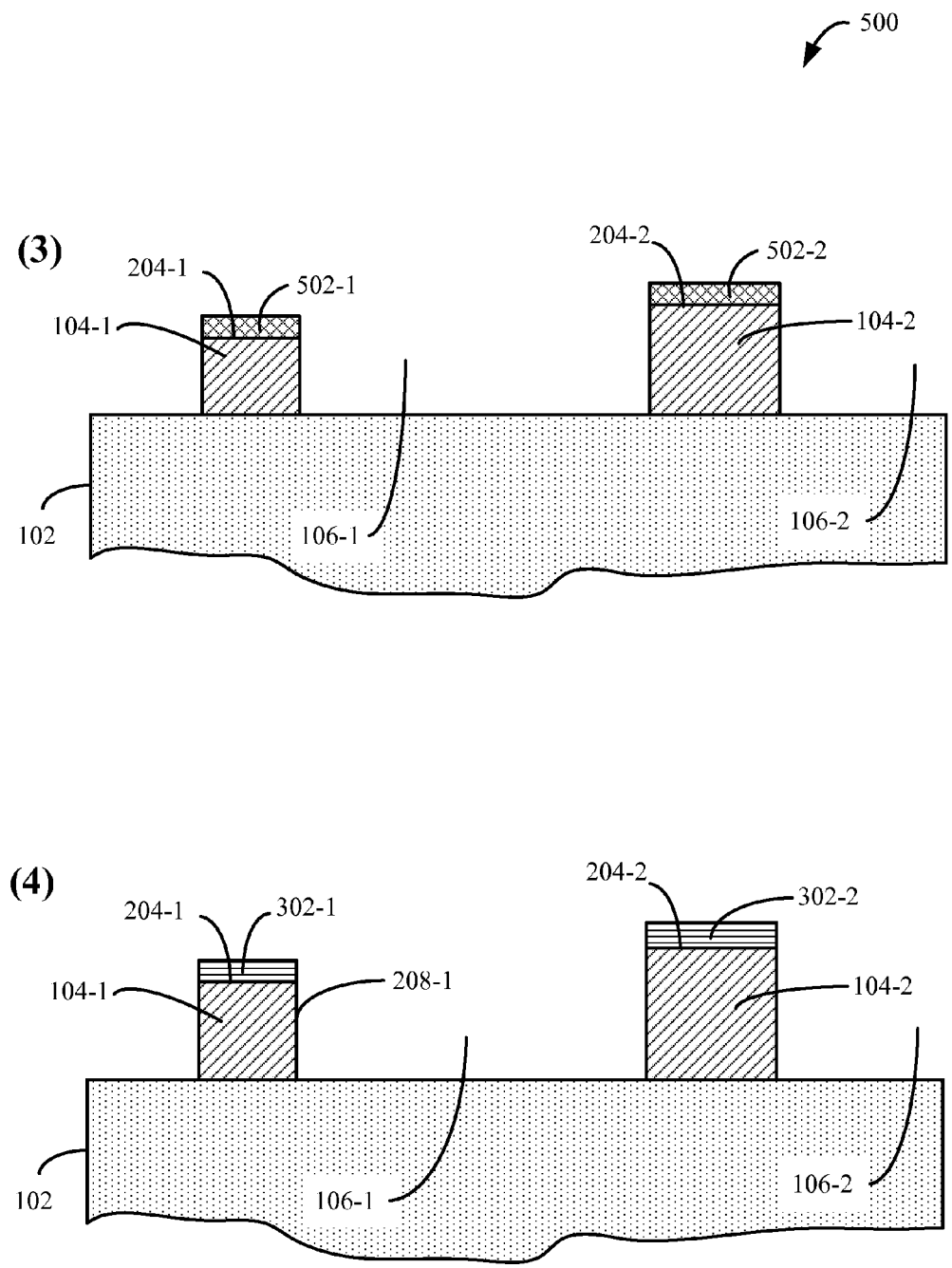

Further, as shown in step 500-3 of FIG. 5B, a graphene initiating layer (e.g., graphene initiating layer 502, including segmented graphene initiating layers 502-1 and 502-2) is segmentedly deposited (e.g., through a process such as chemical vapor deposition or sputtering) onto the top surface (e.g., top surface 204-1, 204-2) of each respective element in the plurality of elements 104. In some embodiments, the graphene initiating layer substantially comprises a compound of carbon (e.g., silicon carbide). In some embodiments, as shown in step 500-3, the deposited graphene initiating layer (e.g., graphene initiating layer 502, including segmented metal graphene initiating layers 402-1 and 402-2) has a substantially planar profile or substantially planar top surface.

Further, as shown in step 500-4 of FIG. 5B, a graphite-based structure is formed by generating graphene 302 using the graphene initiating layer 502 (e.g., segmented silicon carbide graphene initiating layers 502-1 and 502-2). In some embodiments, where the graphene initiating layer substantially comprises a compound of carbon (e.g., silicon carbide), graphene is generated by heating the graphene initiating layer to vaporize an element other than carbon from the compound of carbon, thereby forming the graphite-based structure. In some embodiments, when graphene initiating layer 502 is made of silicon carbide, graphene 302 is generated using graphene initiating layer 502 by heating the silicon carbide to vaporize elemental silicon in the silicon carbide, thereby forming graphite-based structure. In some embodiments, as shown in step 500-4, the graphene layer 302 generated using the graphene initiating layer has a substantially planar profile or substantially planar top surface.

Figure 5C:
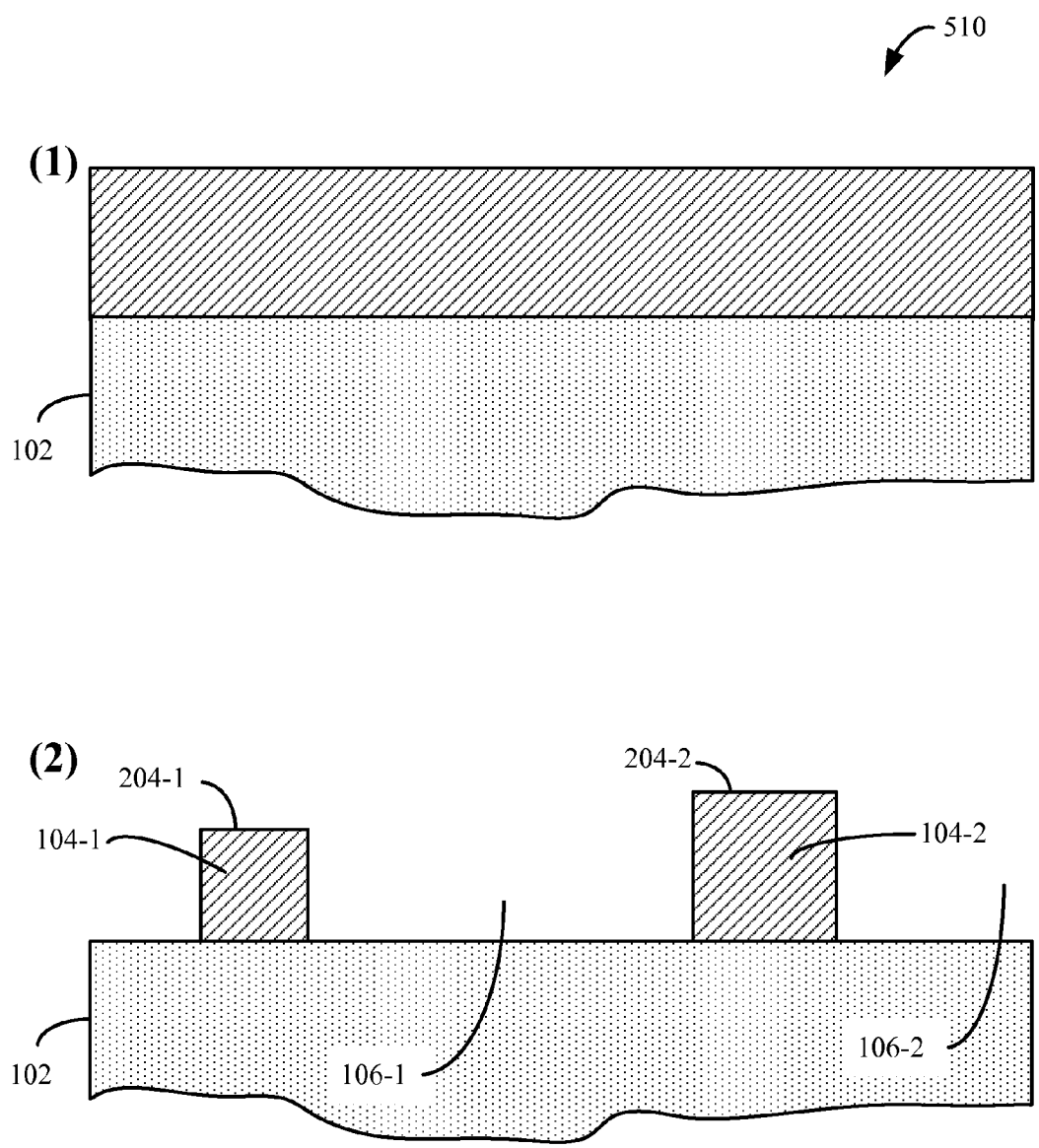
Figure 5D:
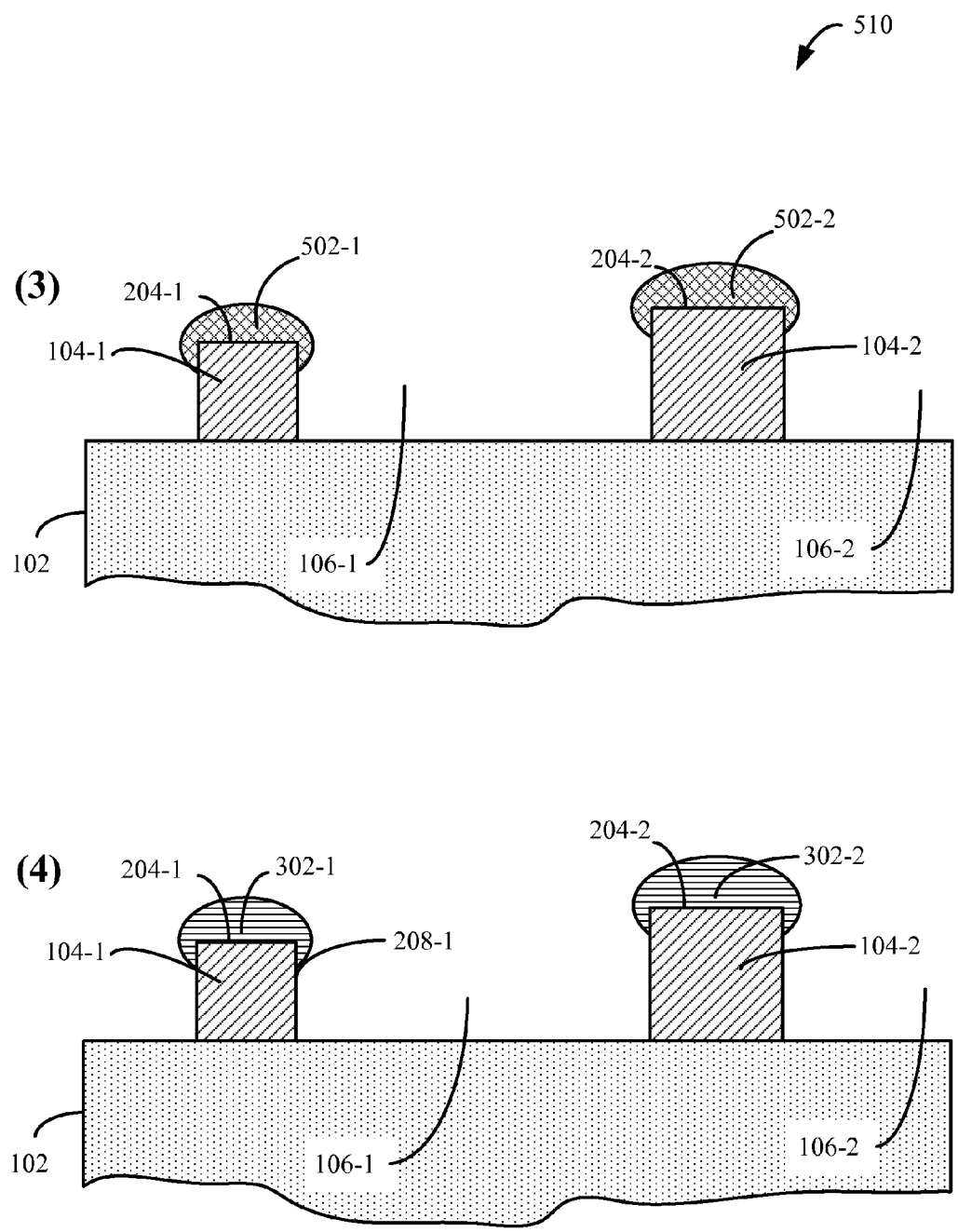

In alternative embodiments, as shown in process 510 (e.g., step 510-3) in FIGS. 5C-5D, the deposited graphene initiating layer (e.g., graphene initiating layer 502, including segmented silicon carbide graphene initiating layers 502-1 and 502-2) has a substantially arcuate profile or substantially arcuate top surface, comprising a meniscus that covers the top surface (e.g., top surfaces 204-1 and 204-2) of each respective element in the plurality of elements 104. In some embodiments, as shown in process 510 (e.g., step 510-4) in FIG. 5D, the graphene layer 302 generated using graphene initiating layer 502 has a substantially arcuate profile or substantially arcuate top surface. As explained above with reference to step 410-5 (FIG. 4C), in some embodiments, a portion of the graphene generated on each respective element (e.g., graphene layer 302-1, 302-2) is isotropically etched so as to define a profile of the side wall (e.g., a substantially planar side wall) of the respective element.

FIGS. 6A-6B and FIGS. 6C-6D include flow diagrams illustrating processes 600 and 610, respectively, for fabricating graphene device topography by exemplary methods (e.g., using a silicon based graphene initiating layer) in accordance with an embodiment of the present disclosure.

Shown in step 600-1 is a substrate 102 comprising a substrate material. As shown in step 600-2, substrate 102 is patterned to form a plurality of elements 104 (e.g., elements 104-1 and 104-2), each respective element in the plurality of elements 104 is separated from an adjacent element on the substrate 102 by a corresponding trench (e.g., trench 106-1, 106-2, and the like) in a plurality of trenches 106 on substrate 102. In some embodiments, the plurality of elements 104 is formed by growing portions of substrate material selectively at regions of the substrate corresponding to the plurality of elements. In some embodiments, the plurality of elements is formed by growing at least one respective secondary material, distinct from a substrate material, selectively on regions of the substrate corresponding to the plurality of elements. In other words, in some embodiments, the plurality of elements 104 comprises substantially the same material as substrate 102. In alternative embodiments, the plurality of elements 104 comprises a respective secondary material, distinct from a substrate material.

Figure 6A:
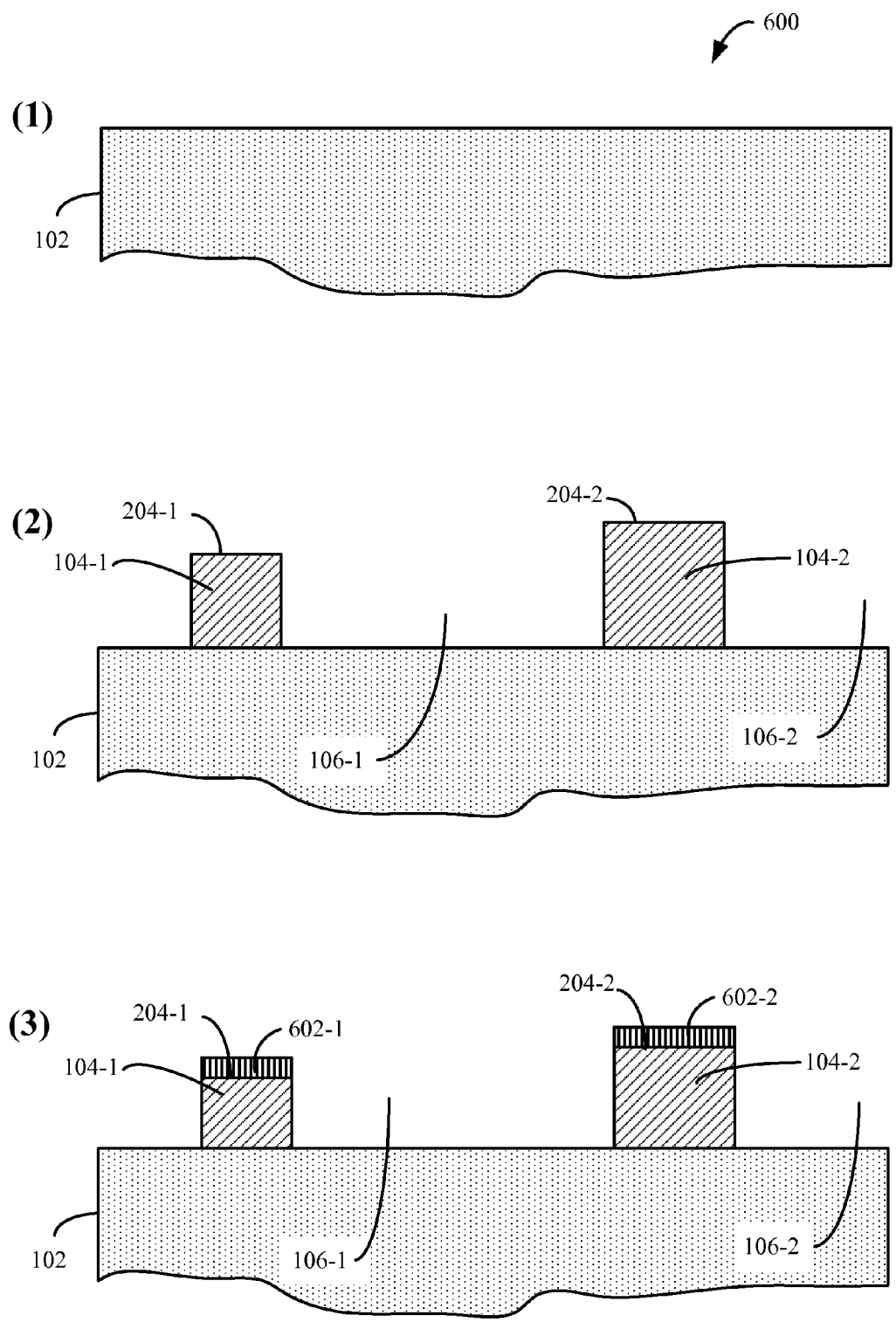

Further, as shown in step 600-3 of FIG. 6A, a graphene initiating layer 602 (e.g., graphene initiating layer 602, including segmented layers 602-1 and 602-2) is segmentedly deposited onto the top surface (e.g., top surface 204-1, 204-2) of one or more elements in the plurality of elements 104. In some embodiments, the graphene initiating layer 602 comprises silicon. In some embodiments, as shown in step 600-3, the deposited graphene initiating layer (e.g., graphene initiating layer 602, including segmented silicon graphene initiating layers 602-1 and 602-2) has a substantially planar profile or substantially planar top surface.

Further, as shown in steps 600-4 and 600-5 of FIG. 6B, a graphite-based structure is formed by generating graphene using the graphene initiating layer 602 (e.g., segmented silicon graphene initiating layers 602-1 and 602-2). As shown in step 600-4, in some embodiments, graphene is generated using the graphene initiating layer by depositing elemental carbon on or into the silicon graphene initiating layer and by subsequently converting the silicon graphene initiating layer into silicon carbide (e.g., silicon carbide layer 502) by enabling a chemical reaction of the silicon graphene initiating layer with the deposited elemental carbon. In some embodiments, elemental carbon is deposited on or into the silicon graphene initiating layer 602 by doping the silicon graphene initiating layer 602 through implantation of the elemental carbon into the silicon graphene initiating layer 602. Further, as shown in step 600-5, the silicon carbide is heated to vaporize the silicon from the silicon carbide by reverse epitaxy, thereby forming the graphite-based structure.

In some embodiments, as shown in step 600-5, the graphene layer generated using the graphene initiating layer has a substantially planar profile or substantially planar top surface. In alternative embodiments, as shown in process 610 (e.g., step 610-3) in FIG. 6C, the deposited graphene initiating layer (e.g., graphene initiating layer 602, including segmented silicon graphene initiating layers 602-1 and 602-2) has a substantially arcuate profile or substantially arcuate top surface, comprising a meniscus that covers the top surface (e.g., top surface 204-1, 204-2) of each respective element in the plurality of elements 104. In some embodiments, as shown in process 610 (e.g., step 610-5) in FIG. 6D the graphene layer generated using graphene initiating layer 602 has a substantially arcuate profile or substantially arcuate top surface. As explained above with reference to step 410-5 (FIG. 4C), in some embodiments, a portion of the graphene generated on each respective element (e.g., graphene layer 302-1, 302-2) is isotropically etched so as to define a profile of the side wall (e.g., a substantially planar side wall) of the respective element.

Figure 7A:
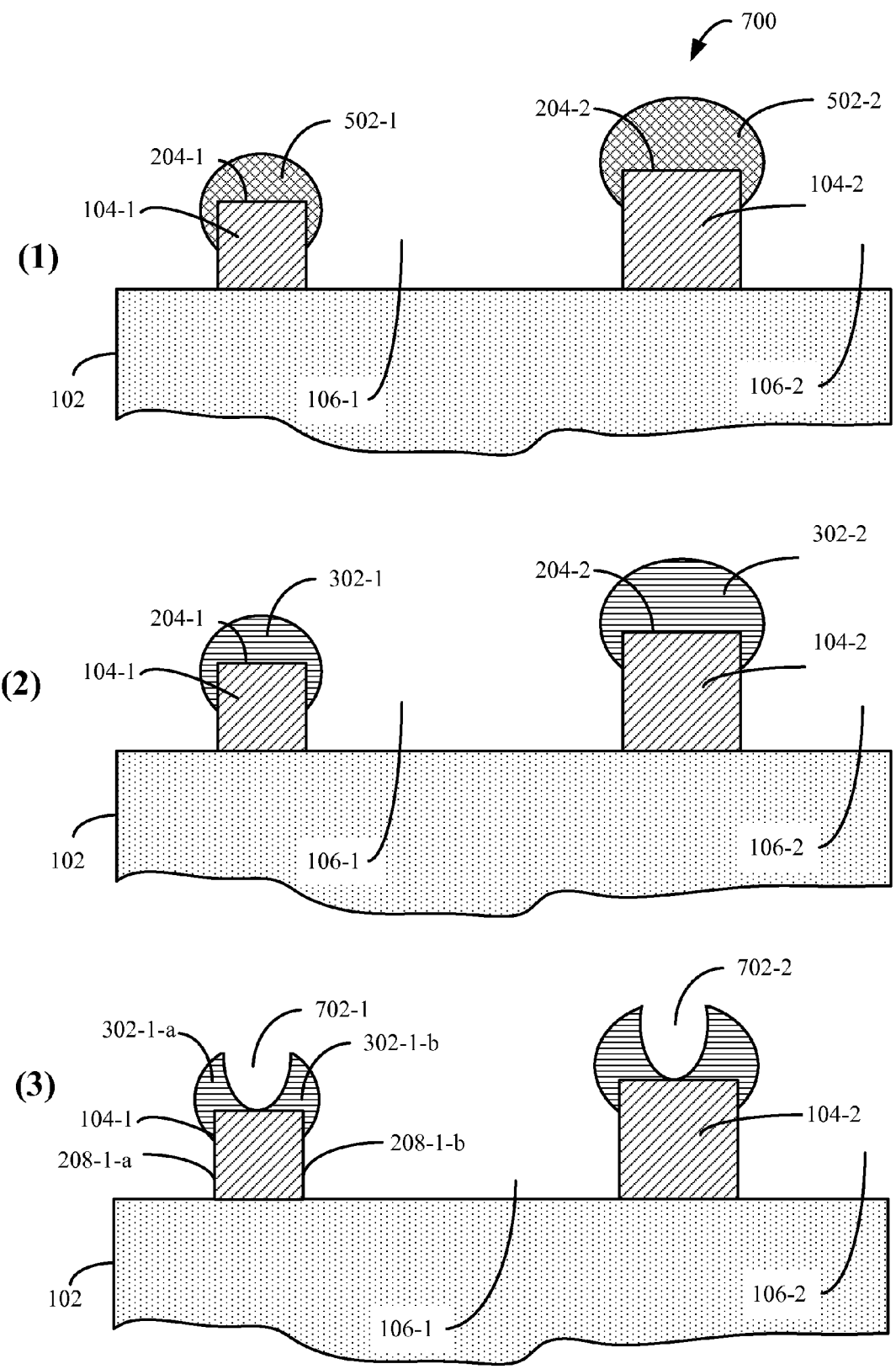
FIGS. 7A-7B include flow diagrams illustrating processes for fabricating graphene device topography by exemplary methods (e.g., for producing etch artifacts before and after graphene-generation) in accordance with an embodiment of the present disclosure.
Figure 7B:
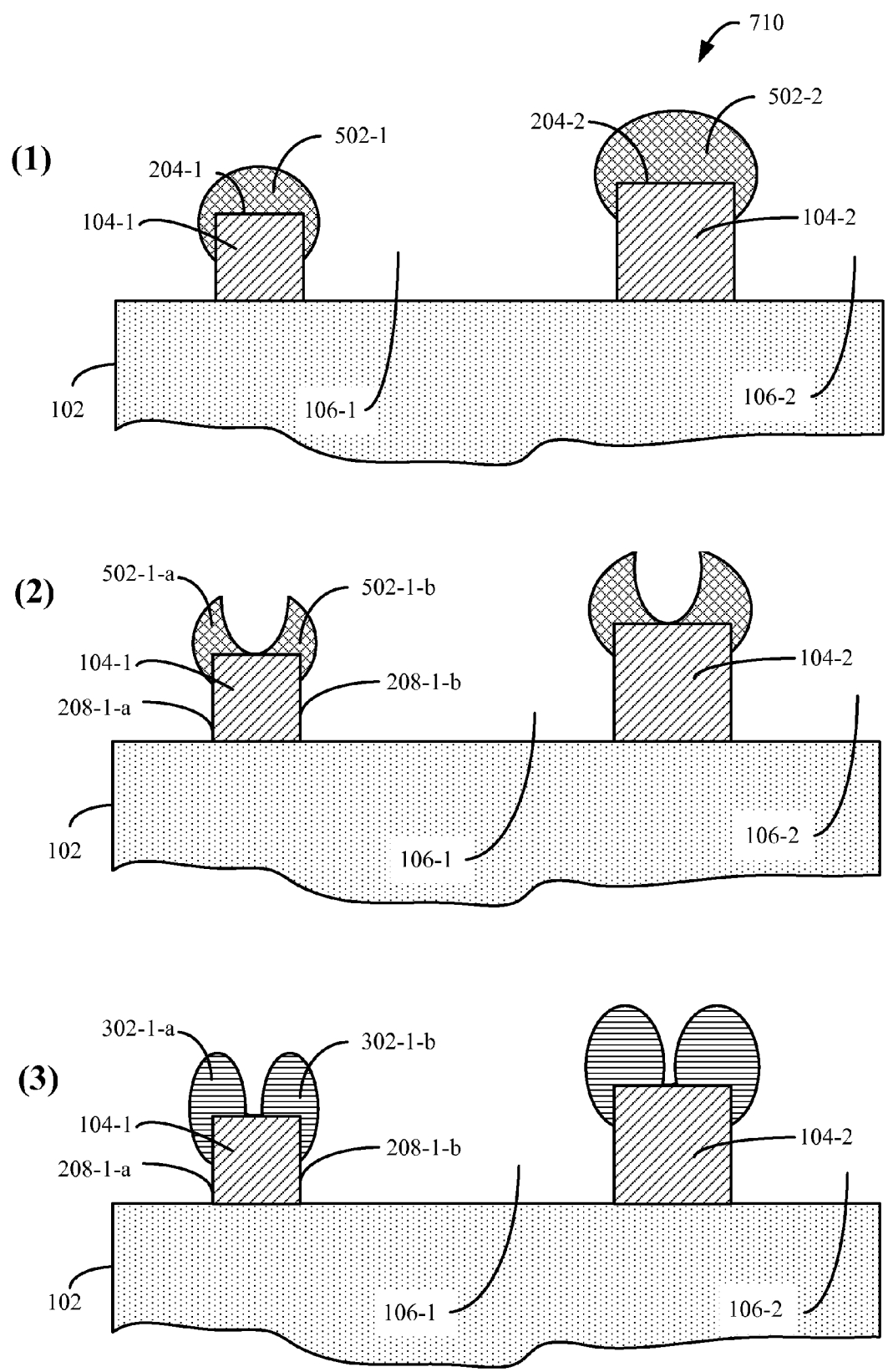

FIGS. 7A-7B include flow diagrams illustrating processes 700 and 710 for fabricating graphene device topography by exemplary methods (e.g., for producing etch artifacts before and after graphene-generation) in accordance with an embodiment of the present disclosure. Furthermore, FIGS. 7C-7D include cross-sectional views illustrating graphene layer encapsulation profiles of graphene device topography and etch artifacts fabricated by methods described in FIGS. 7A-7B, respectively.

Shown in FIG. 7A is process 700 for producing etch artifacts by etching a substantially central portion of the graphene layer 302 so as to generate a pair of graphene layers—one on each side wall—corresponding to each respective element in the plurality of elements 104 after generating graphene using the silicon carbide graphene initiating layer 502.

Figure 7C:
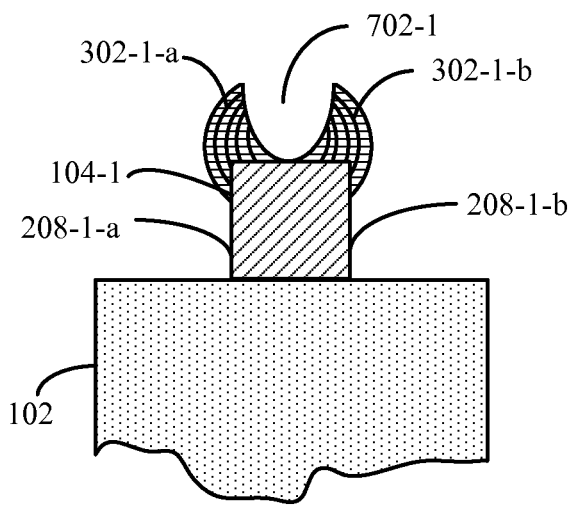
FIGS. 7C-7D include cross-sectional views illustrating graphene layer encapsulation profiles of graphene device topography and etch artifacts fabricated by methods described in FIGS. 7A-7B, respectively.

As shown in step 700-1, a graphene initiating layer (e.g., graphene initiating layer 502, including segmented silicon carbide layers 502-1 and 502-2) is segmentedly deposited onto the top surface (e.g., top surface 204-1, 204-2) of each respective element in the plurality of elements 104 (e.g., as described with reference to processes 500-510 and 600-610). As shown in step 700-2, the silicon carbide is heated to vaporize the silicon from the silicon carbide by reverse epitaxy, thereby forming graphite-based structure 302. As shown in step 700-3, after generating graphene (e.g., graphite-based structure 302, including graphite-based structure 302-1 and 302-2) using graphene initiating layer 502, for each respective element of the plurality of elements 104, a meniscus 702 (e.g., including meniscus 702-1 and 702-1) is anisotropically etched into the graphene thereby consuming a substantially central portion of the graphene to form a plurality of graphite-based structures for each respective element (e.g., graphite-based structures 302-1-*a* and 302-1-*b* for element 104-1, graphite-based structures 302-2-*a* and 302-2-*b* for element 104-2). In some embodiments, the plurality of graphite-based structures for each respective elements includes a first graphite-based structure substantially along a portion of a first side wall of each respective element (e.g., first graphite-based structure 302-1-*a* substantially along first side wall 208-1-*a* of element 104-1) and a second graphite-based structure substantially along a portion of a second side wall of each respective element (e.g., second graphite-based structure 302-1-*b* substantially along second side wall 208-1-*b* of element 104-1). In some embodiments, the plurality of graphite-based structures for each respective element (e.g., graphite-based structures 302-1-*a* and 302-1-*b* for element 104-1, graphite-based structures 302-2-*a* and 302-2-*b* for element 104-2) generated by process 700 described above is characterized by a first graphene layer encapsulation profile (e.g., as shown in FIG. 7C). Referring to FIG. 7A, one of skill in the art will appreciate that, in some embodiments, wall 301-1-*a* and wall 301-1-*b* are in fact united and form a close form shape, such as a circle oval, or n-gon, where n is an integer of 3 or greater and thus 702-1 is in fact an interior or hole. In such embodiments, the interior 702-1 has a characteristic dimension (e.g., width) that is on the nanometer scale. Thus, in such embodiments, what is seen in FIG. 7A in such embodiments is a cross section through the device. In other embodiments, walls 302-1-*a* and 301-1-*b* do not contact each other.

Shown in FIG. 7B is process 710 for producing etch artifacts by etching a substantially central portion of the silicon carbide graphene initiating layer 502 so as to generate a pair of graphene initiating layers—one on each side wall—corresponding to each respective element in the plurality of elements prior to generation of graphene using the silicon carbide graphene initiating layer prior to graphene growth, followed by graphene growth on each graphene initiating layer of the pair of graphene initiating layers.

Figure 7D:
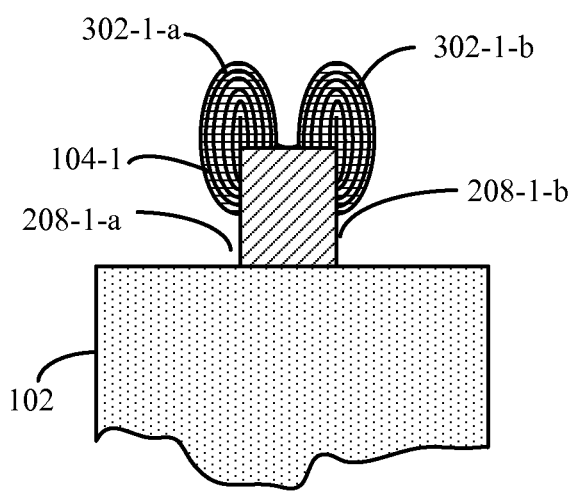
Figure 8A:
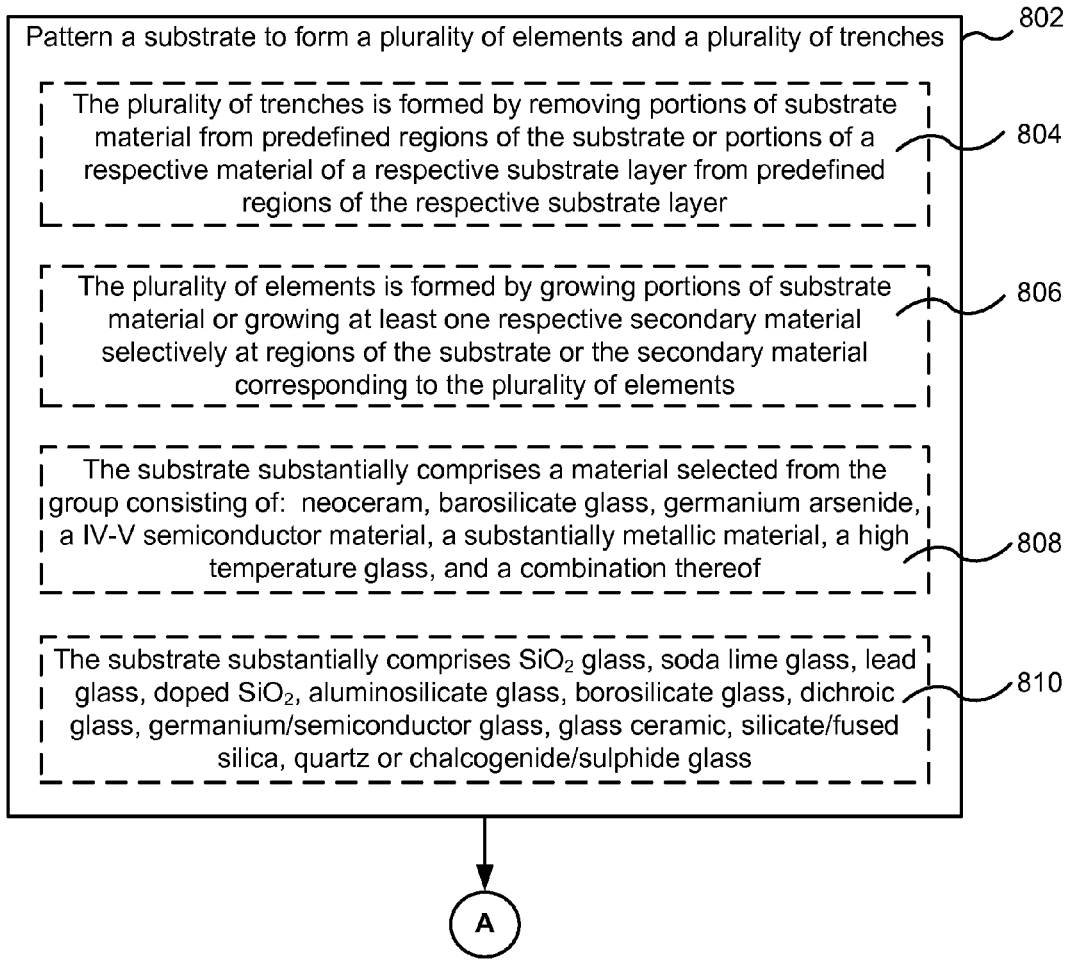
FIGS. 8A-8D illustrate a flowchart of a method for fabricating graphene device topographies on a substrate in accordance with an embodiment of the present disclosure.
Figure 8B:
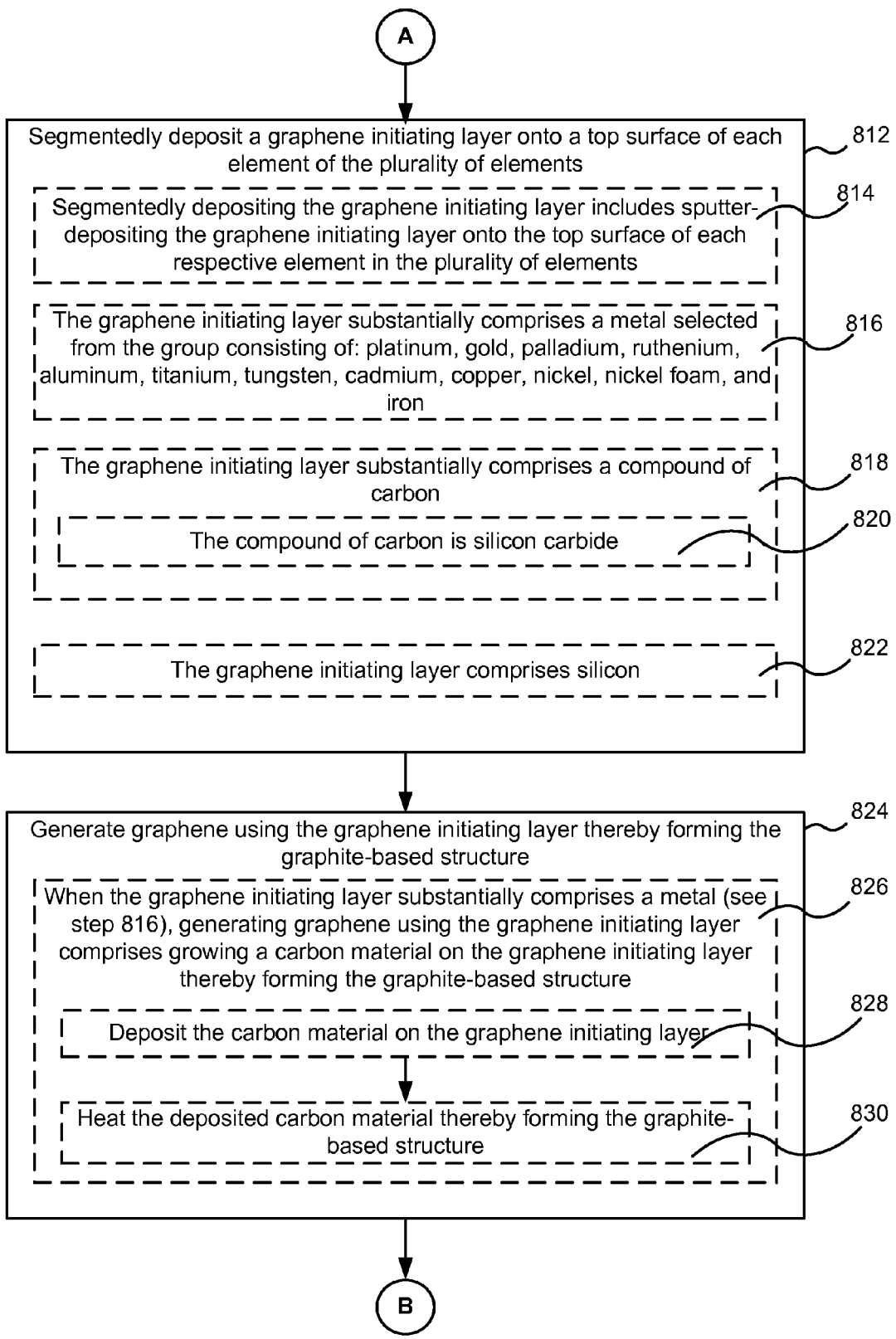
Figure 8C:
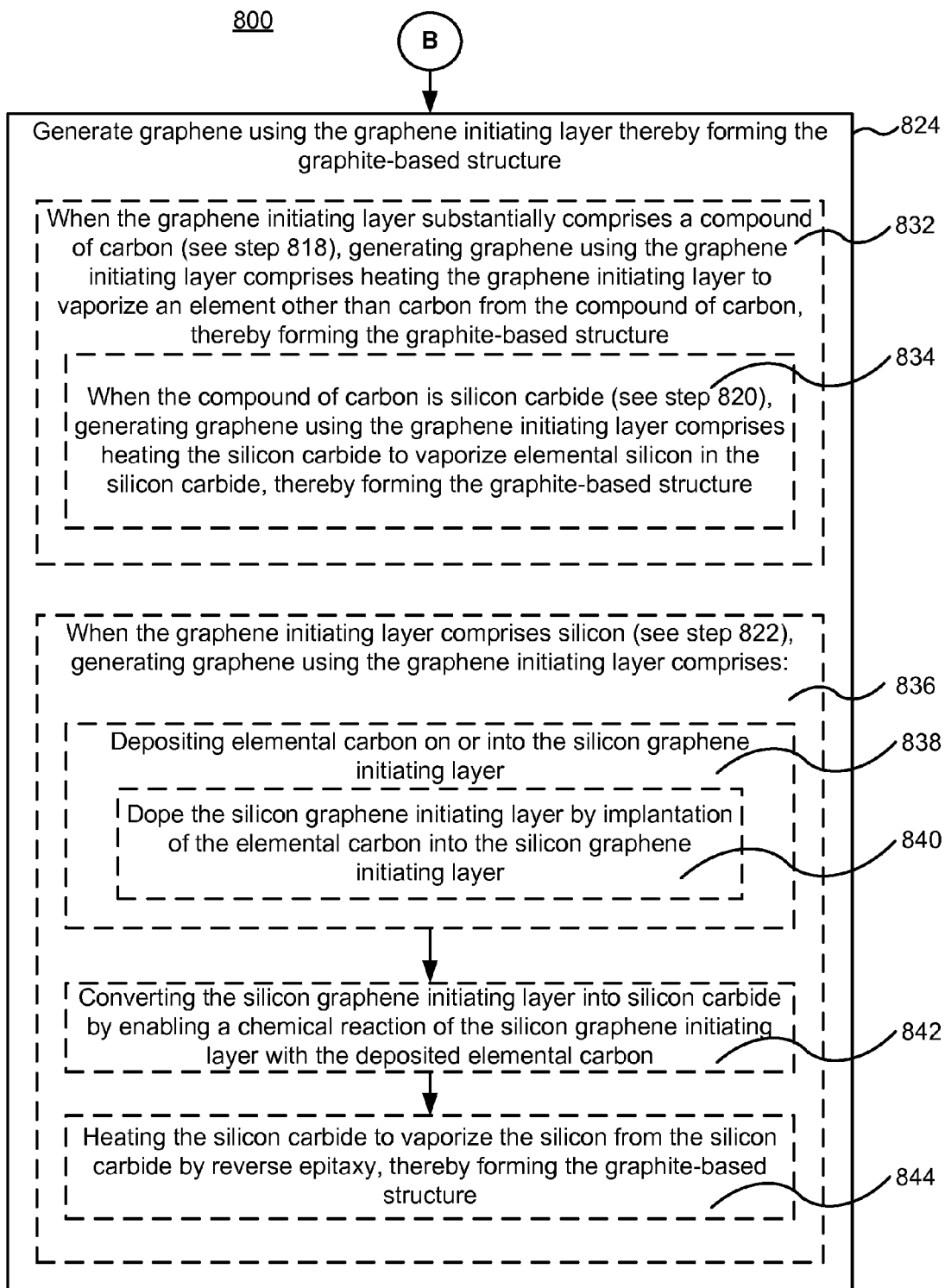
Figure 8D:
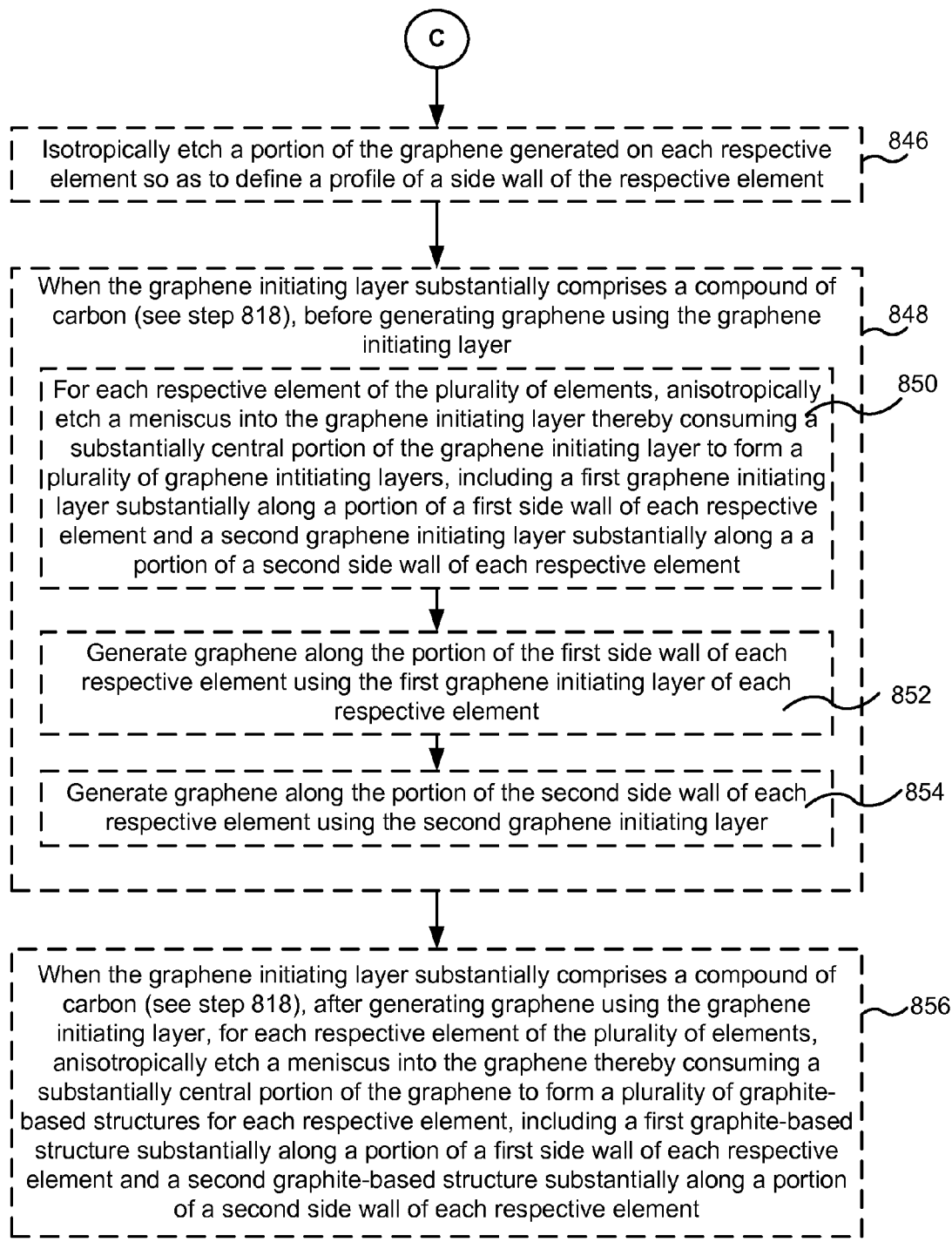

As shown in step 710-1, a graphene initiating layer (e.g., graphene initiating layer 502, including segmented silicon carbide layers 502-1 and 502-2) is segmentedly deposited onto the top surface (e.g., top surface 204-1, 204-2) of each respective element in the plurality of elements 104 (e.g., as described with reference to processes 500-510 and 600-610). As shown in step 710-2, (e.g., before generating graphene using silicon carbide graphene initiating layer 502), for each respective element of the plurality of elements 104, a meniscus is anisotropically etched into silicon carbide graphene initiating layer 502 thereby consuming a substantially central portion of silicon carbide graphene initiating layer 502 to form a plurality of graphene initiating layers, including a first graphene initiating layer substantially along a portion of a first side wall of each respective element (e.g., first graphene initiating layer 502-1-*a* formed substantially along first side wall 208-1-*a* of element 104-1) and a second graphene initiating layer substantially along a portion of a second side wall of each respective element (e.g., second graphene initiating layer 502-1-*b* formed substantially along second side wall 208-1-*b* of element 104-1). As shown in step 710-3, after forming a plurality of graphene initiating layers for each respective element of the plurality of elements 104, graphene is generated along the portion of the first side wall of each respective element using the first graphene initiating layer of each respective element (e.g., graphene 302-1-*a* is generated along the portion of the portion of first side wall 208-1-*a* of element 104-1 using the first graphene initiating layer 502-1-*a*). Similarly, graphene is generated along the portion of the second side wall of each respective element using the second graphene initiating layer of each respective element (e.g., graphene 302-1-*b* is generated along the portion of the portion of second side wall 208-1-*b* of element 104-1 using the second graphene initiating layer 502-1-*b*). In some embodiments, the plurality of graphite-based structures for each respective element (e.g., graphite-based structures 302-1-*a* and 302-1-*b* for element 104-1, graphite-based structures 302-2-*a* and 302-2-*b* for element 104-2) generated by process 700 described above is characterized by a second graphene layer encapsulation profile (e.g., as shown in FIG. 7D).

In some embodiments, the second graphene encapsulation profile (FIG. 7D) generated from process 700 (FIG. 7A) is different from the first graphene encapsulation profile (FIG. 7C) generated from process 710 (FIG. 7B). It will be understood that although the graphene initiating layer described in FIGS. 7A-7B is silicon carbide, a metal-based graphene initiating layer (e.g., as described with reference to process 400 in FIG. 4A and process 410 in FIGS. 4B-4C) or a silicon based graphene initiating layer (e.g., as described with reference to process 600 in FIGS. 6A-6B or process 610 in FIGS. 6C-6D) may also be used to generate the etch profiles and graphite-based structures described in FIGS. 7A-7D above.

FIGS. 8A-8D include a flowchart representing a method 800 for fabricating a graphene device topography on a substrate (e.g., method of forming a graphite-based structure on a substrate) in accordance with some embodiments of the present disclosure.

The method includes patterning (802) the substrate thereby forming a plurality of elements (e.g., elements 104, FIGS. 1A-1B and FIGS. 2A-2B) on the substrate, each respective element in the plurality of elements separated from an adjacent element on the substrate by a corresponding trench in a plurality of trenches (e.g., trenches 106, FIG. 1A-1B and FIGS. 2A-2B) on the substrate. Each respective element in the plurality of elements has a corresponding top surface (e.g., top surface 204 of elements 104, FIG. 1B and FIG. 2B), each respective trench in the plurality of trenches is characterized by a trench surface (e.g., trench surface 206 of trenches 106, FIG. 1B and FIG. 2B). Each respective trench in the plurality of trenches separates a pair of adjacent elements in the plurality of elements, each top surface of each respective element in the plurality of elements is separated from an adjacent trench surface by a side wall of the respective element (e.g., top surface 204-1 of element 104-1 is separated from trench surface 206-1 of adjacent trench 106-1 by side wall 208-1 of elements 104-1, FIG. 1B). A top surface of a first element in the plurality of elements is characterized by a first elevation (e.g., elevation H1 of top surface 204-1, FIG. 1B), a trench surface of a first trench in the plurality of trenches, the first trench separating the first element from another element in the plurality of elements, is characterized by a second elevation (e.g., elevation H2 of trench surface 206-1, FIG. 1B), the first elevation is other than the second elevation, and a first orthogonal projection of the top surface of the first element and a second orthogonal projection of the trench surface of the first trench onto a common plane are contiguous or overlapping.

In some embodiments, the plurality of trenches is formed (804) by removing portions of substrate material from predefined regions of the substrate (e.g., as explained above with reference to steps 500-1 and 500-2 in FIG. 5A; and steps 510-1 and 510-2 in FIG. 5C). In some embodiments, removing portions of the substrate material includes etching the plurality of trenches into the substrate. In some embodiments, the substrate includes a plurality of layers (e.g., substrate layer 102 and respective substrate layer 103, as shown in step 500-1 in FIG. 5A, and in step 510-1 in FIG. 5C) wherein the plurality of layers includes at least one respective substrate layer and wherein the substrate comprises a plurality of materials, including a respective material of the respective substrate layer; and the plurality of trenches is formed by removing portions of the respective material from predefined regions of the respective substrate layer. In some embodiments, removing portions of the respective material from predefined regions of the respective substrate layer includes etching the plurality of trenches into the respective substrate layer.

In some embodiments, the respective substrate layer comprises a photoresist material, and removing portions of the respective material from predefined regions of the respective substrate layer includes removing a portion of the photoresist material using photolithography. In some embodiments, etching the plurality of trenches into the substrate includes photolithography, x-ray lithography, reactive ion-etching, plasma etching, sputter etching, e-beam direct writing, or a combination thereof.

In some embodiments, the plurality of elements is formed by growing (806) portions of substrate material selectively at regions of the substrate corresponding to the plurality of elements (e.g., as explained above with reference to steps 400-1 and 400-2 in FIG. 4A; and steps 410-1 and 410-2 in FIG. 4B). In some embodiments, the substrate comprises a first material and the plurality of elements is formed by growing at least one respective secondary material (e.g., as shown in step 400-2, FIG. 4A), distinct from the first material, selectively on regions of the substrate corresponding to the plurality of elements. In some embodiments, the respective secondary material comprises one or more of: a dielectric material, a metal oxide, a metal nitride, a semiconductor material, a metal, or a combination thereof. In some embodiments, the respective secondary material comprises silicon dioxide, silicon nitride, or a combination thereof. In some embodiments, the respective secondary material comprises titanium dioxide. In some embodiments, the respective secondary material comprises titanium nitride. In some embodiments, the respective secondary material comprises silicon, gallium arsenide, germanium, or a combination thereof. In some embodiments, the respective secondary material comprises a group VII-IX metal including one or more of metals selected from the group consisting of copper, nickel, iron, platinum, gold, palladium, and ruthenium. In some embodiments, the respective secondary material comprises aluminum, titanium, tungsten, cadmium, silver, platinum, tantalum, hafnium, vanadium, or a combination thereof. In some embodiments, the respective secondary material is titanium, titanium dioxide, titanium nitride, or any combination thereof. In some embodiments, the respective secondary material is tantalum, tantalum oxide, tantalum nitride, or any combination thereof. In some embodiments, the respective secondary material is hafnium, hafnium oxide, hafnium nitride, or any combination thereof. In some embodiments, the respective secondary material is vanadium, vanadium dioxide, vanadium nitride, or any combination thereof.

In some embodiments, the method further comprises iteratively growing the respective secondary material, depositing the graphene-initiating layer, and generating graphene a plurality of times thereby forming alternating layers of the respective secondary material and graphene. For example, step 400-2, step 410-3, and step 410-4 (FIG. 4A) are iteratively performed a plurality of times to form alternating layers of the respective secondary material and graphene.

In some embodiments, the substrate substantially comprises (808) neoceram, barosilicate glass, germanium arsenide, a IV-V semiconductor material, a substantially metallic material, a high temperature glass, or a combination thereof. In some embodiments, the substrate substantially comprises (810) $SiO_2$ glass, soda lime glass, lead glass, doped $SiO_2$, aluminosilicate glass, borosilicate glass, dichroic glass, germanium/semiconductor glass, glass ceramic, silicate/fused silica, quartz or chalcogenide/sulphide glass.

The method includes segmentedly depositing (812) a graphene initiating layer onto the top surface of each respective element in the plurality of elements. In some embodiments, the segmentedly deposited graphene initiating layers are mutually disjoint, isolated or discontinuous. In some embodiments, segmentedly depositing the graphene initiating layer includes sputter-depositing (814) the graphene initiating layer onto the top surface of each respective element in the plurality of elements. In some embodiments, sputter-depositing the graphene initiating layer is performed at a sputter-depositing energy selected in accordance with a feature aspect ratio defined by a ratio of a central tendency of respective widths of the plurality of trenches to a central tendency of respective heights of the plurality of elements.

In other words, the extent or depth of deposition of the graphene initiating layer along the top surface and side wall of each respective element depends on the energy with which the graphene initiating layer is sputter-deposited onto each respective element and the spatial separation between consecutive elements. For example, a higher sputter-deposition energy results in greater depth of penetration of the material of the graphene initiating layer into the sidewalls of the elements and optionally into the trench surfaces of the elements for a given spatial separation between adjacent elements. Conversely, a greater spatial separation between consecutive elements would allow for greater penetration of the material of the graphene initiating layer along the sidewalls of the elements and into the trenches between adjacent elements, for a given sputter-deposition energy. In some embodiments, to prevent penetration of the material of the graphene initiating layer along the sidewalls of the elements and into the trenches between adjacent elements, or to restrict the sputter-deposition of the material of the graphene initiating layer to the top surface of each respective element, a lower sputter-deposition energy is selected for elements having a greater average spatial separation (e.g., elements that are on an average placed further apart) as compared to elements having a lower average spatial separation (e.g., elements that are on an average placed in close spatial proximity to one another). In some embodiments, sputter-depositing the graphene initiating layer includes sputtering a target composed substantially of a material corresponding to a material of the graphene initiating layer.

In some embodiments, the graphene initiating layer substantially comprises (816) a metal selected from the group consisting of: platinum, gold, palladium, ruthenium, aluminum, titanium, tungsten, cadmium, copper, nickel, nickel foam, and iron (for example, as explained with reference to process 400 in FIG. 4A and process 410 in FIGS. 4B-4C).

In some embodiments, the graphene initiating layer substantially comprises (818) a compound of carbon (for example, as explained with reference to process 500 in FIGS. 5A-5B and process 510 in FIGS. 5C-5D). In such embodiments, segmentedly depositing the graphene initiating layer includes depositing, through chemical vapor deposition, the graphene initiating layer onto the top surface of each respective element in the plurality of elements. In some embodiments, the compound of carbon is (820) silicon carbide. In some embodiments, the graphene initiating layer comprises (822) silicon (for example, as explained with reference to process 600 in FIGS. 6A-6B and process 610 in FIGS. 6C-6D).

The method further includes generating (824) graphene using the graphene initiating layer thereby forming the graphite-based structure. In some embodiments, when the graphene initiating layer substantially comprises a metal (see step 816), generating graphene using the graphene initiating layer comprises growing (826) a carbon material on the graphene initiating layer thereby forming the graphite-based structure (e.g., as explained with reference to step 400-4, FIG. 4A and step 410-4, FIG. 4C). In some embodiments, growing the carbon material on the graphene initiating layer comprises: depositing (828) the carbon material on the graphene initiating layer; and heating (830) the deposited carbon material thereby forming the graphite-based structure. In some embodiments, the carbon material is elemental carbon or a mixture of carbon and oxygen.

In some embodiments, when the graphene initiating layer substantially comprises a compound of carbon (see step 818), generating graphene using the graphene initiating layer comprises heating (832) the graphene initiating layer to vaporize an element other than carbon from the compound of carbon, thereby forming the graphite-based structure (e.g., as explained with reference to steps 500-3 and 500-4, FIG. 5B; and steps 510-3 and 510-4, FIG. 5D). In some embodiments, when the compound of carbon is silicon carbide (see step 820), generating graphene using the graphene initiating layer comprises heating (834) the silicon carbide to vaporize elemental silicon in the silicon carbide, thereby forming the graphite-based structure.

Figure 6C:
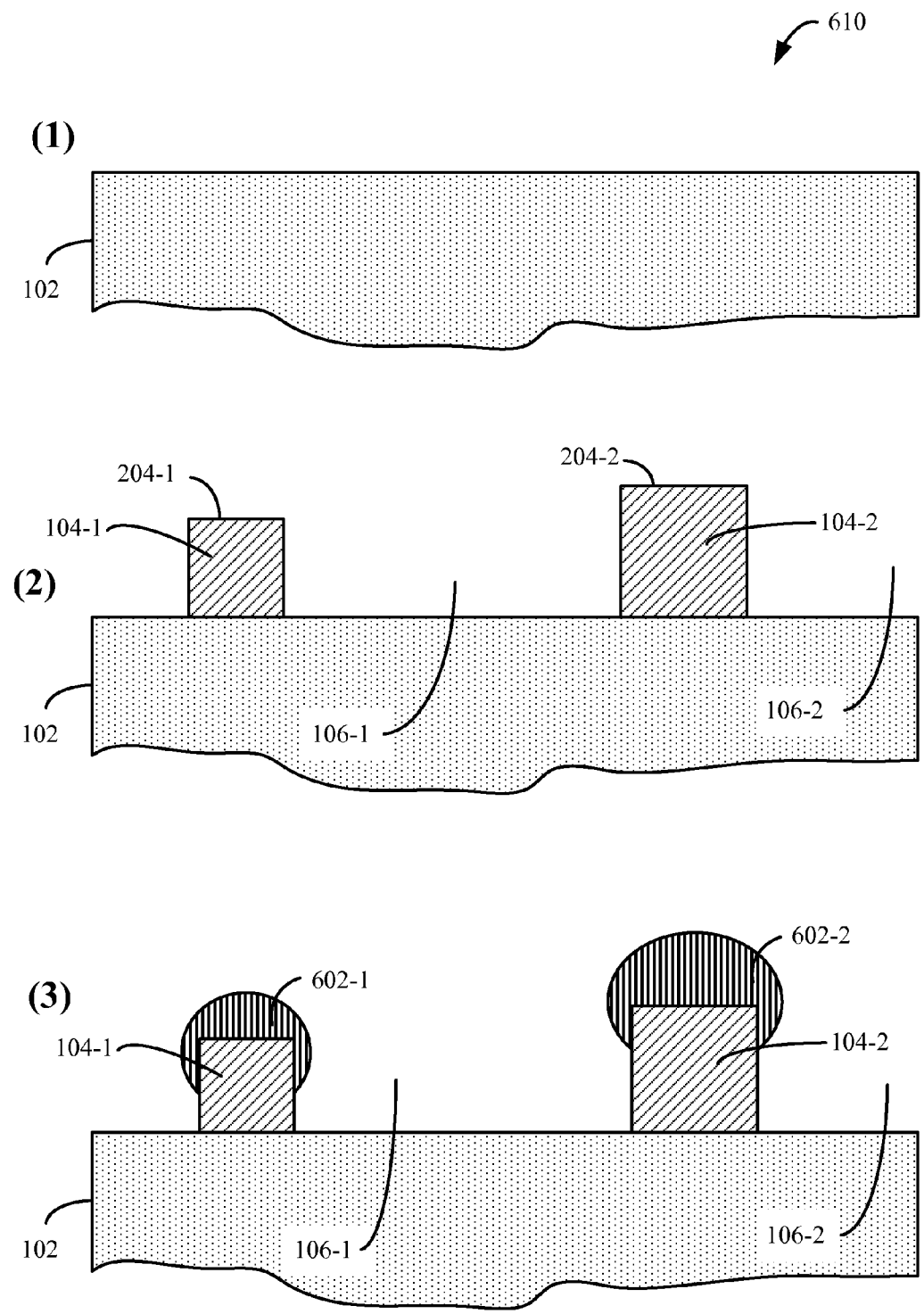

In some embodiments, when the graphene initiating layer comprises silicon (see step 822), generating graphene using the graphene initiating layer comprises: depositing (838) elemental carbon on or into the silicon graphene initiating layer (e.g., as explained with reference to steps 600-3 and 600-4, FIGS. 6A-6B; and steps 610-3 and 610-4, FIGS. 6C-6D). In some embodiments, depositing elemental carbon on or into the silicon graphene initiating layer includes doping (840) the silicon graphene initiating layer by implantation of the elemental carbon into the silicon graphene initiating layer.

In some embodiments, the silicon graphene initiating layer is doped with elemental carbon using ion implantation (e.g., resulting in a change in the physical, chemical, and/or electrical properties of the silicon graphene initiating layer). During ion implantation, ions (e.g., charged atoms or molecules, in this example, charged carbon atoms) are created via an enormous electric field stripping away an electron. These ions are filtered and accelerated toward the target (e.g., toward the silicon graphene initiating layer), and buried in the target. The depth of the implantation depends on the acceleration energy (e.g., voltage). The ions alter the elemental composition of the target if the ions differ in composition from the target (e.g., the process results in a conversion of silicon to silicon carbide). They can also change physical, chemical or electrical properties of the target by transferring their energy and momentum to the electrons and atomic nuclei of the target material. For example, they can change the crystal structure of the target by the energetic collision cascades.

In various embodiments, the ion implantation is performed with a dose between $10^8$ ions/cm$^2$ and $10^{21}$ ions/cm$^2$, and an energy between 5 KeV and 400 KeV. By controlling the implantation dose or energy, the ion implantation controls the carbon penetration into the selected surfaces, thus controlling the carbon concentration or profile at or near the selected surfaces. As a result, the ion implantation provides an accurate control of the thickness of the subsequently generated graphene layers. More information on doping the patterned structures with carbon can be found, for example, in copending U.S. Patent Provisional Application No. 61/745,464, the entire content of which is hereby incorporated by reference herein in its entirety.

Figure 6D:
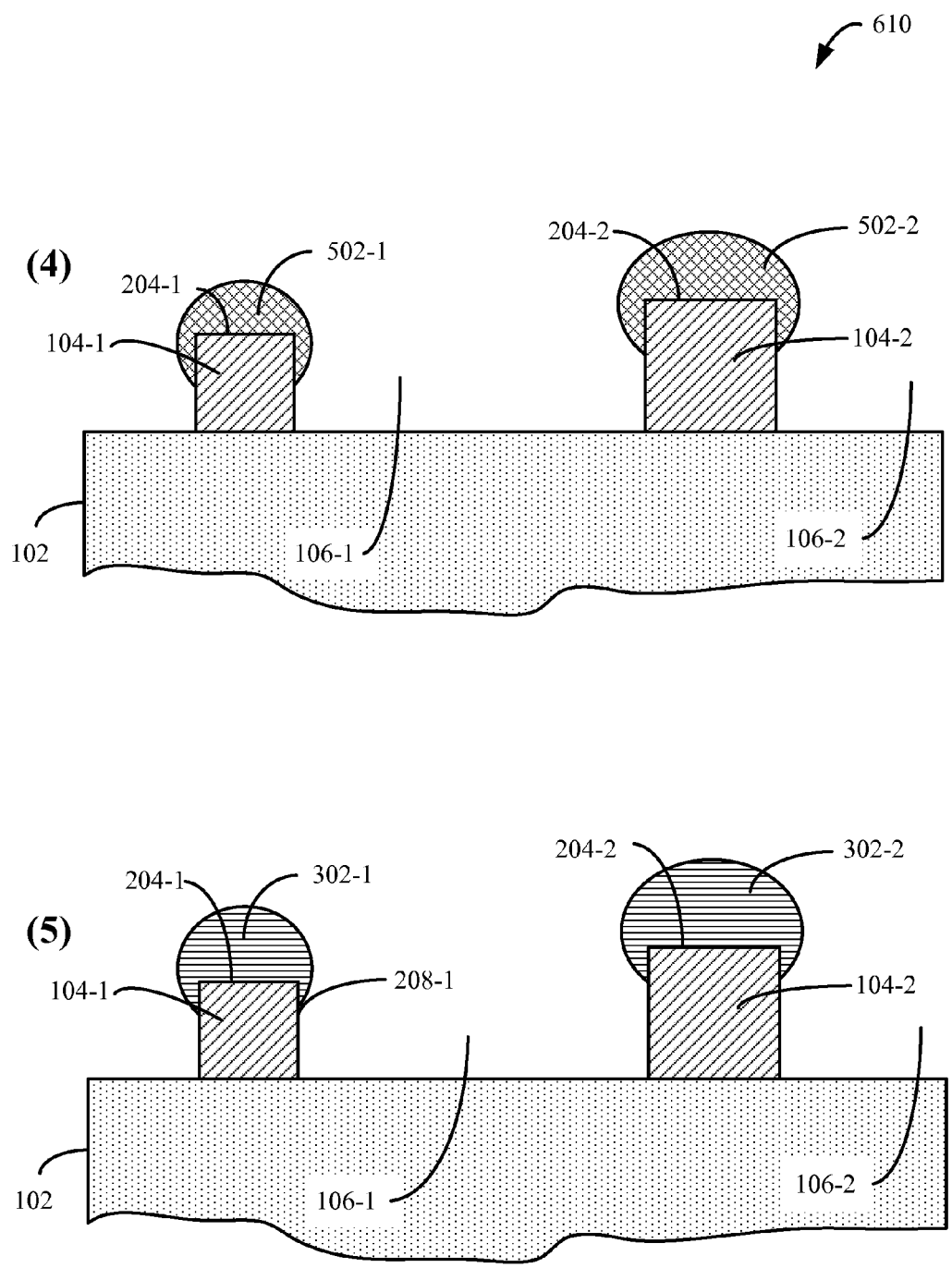

In some embodiments, when the graphene initiating layer comprises silicon (see step 822), generating graphene using the graphene initiating layer further comprises converting (842) the silicon graphene initiating layer into silicon carbide by enabling a chemical reaction of the silicon graphene initiating layer with the deposited elemental carbon; and heating (844) the silicon carbide to vaporize the silicon from the silicon carbide by reverse epitaxy, thereby forming the graphite-based structure (e.g., as explained with reference to steps 600-4 and 600-5, FIG. 6B; and steps 610-4 and 610-5, FIG. 6D).

In some embodiments, the method further comprises isotropically etching (846) a portion of the graphene generated on each respective element so as to define a profile of the side wall of the respective element. For example, as explained with reference to steps 410-4 and 410-5 (FIG. 4C), a substantially arcuate top surface of the graphene layer 302 is etched isotropically so as to form a substantially planar side wall of the respective element.

In some embodiments, when the graphene initiating layer substantially comprises a compound of carbon (see step 818), the method further comprises before generating graphene using the graphene initiating layer, for each respective element of the plurality of elements, anisotropically etching (850) a meniscus into the graphene initiating layer thereby consuming a substantially central portion of the graphene initiating layer to form a plurality of graphene initiating layers (e.g., as explained with reference to process 710, FIG. 7B), including a first graphene initiating layer (e.g., first graphene initiating layer 502-1-a, FIG. 7B) substantially along a portion of a first side wall (e.g., first side wall 208-1-a, FIG. 7B) of each respective element and a second graphene initiating layer (e.g., second graphene initiating layer 502-1-b, FIG. 7B) substantially along a portion of a second side wall (e.g., second side wall 208-1-b, FIG. 7B) of each respective element. The method also comprises generating (852) graphene along the portion of the first side wall of each respective element using the first graphene initiating layer of each respective element; and generating (854) graphene along the portion of the second side wall of each respective element using the second graphene initiating layer.

In some embodiments, when the graphene initiating layer substantially comprises a compound of carbon (see step 818), the method further comprises after generating graphene using the graphene initiating layer, for each respective element of the plurality of elements, anisotropically etching (856) a meniscus into the graphene thereby consuming a substantially central portion of the graphene to form a plurality of graphite-based structures for each respective element (e.g., as explained with reference to process 700, FIG. 7A), including a first graphite-based structure (e.g., first graphite-based structure 302-1-a, FIG. 7A) substantially along a portion of a first side wall (e.g., first side wall 208-1-a, FIG. 7A) of each respective element and a second graphite-based structure (e.g., second graphite-based structure 302-1-b, FIG. 7A) substantially along a portion of a second side wall (e.g., second side wall 208-1-b, FIG. 7A) of each respective element.

Deposition Methods

The following subsections describe individual fabrication techniques that can be used to deposit material, e.g. element 104 and graphene initiating layer 402, hereinafter referred to collectively as "deposit materials," in accordance with embodiments of the present disclosure.

Chemical Vapor Deposition

In some embodiments, one or more layers of the deposit materials are deposited by chemical vapor deposition. In chemical vapor deposition (CVD), the constituents of a vapor phase, often diluted with an inert carrier gas, react at a hot surface (typically higher than 190° C.) to deposit a solid film. Generally, chemical vapor deposition reactions require the addition of energy to the system, such as heating the chamber or the wafer. For more information on chemical vapor deposition, exemplary devices used to perform chemical vapor deposition, and process conditions are used to perform chemical vapor deposition of silicon nitride, see Van Zant, Microchip Fabrication, Fourth Edition, McGraw-Hill, New York, 2000, pp. 363-393; and Madou, Fundamentals of Microfabrication, Second Edition, 2002, pp. 144-154, CRC Press, each of which are hereby incorporated by reference herein in their entireties.

Reduced Pressure Chemical Vapor Deposition

In some embodiments, one or more layers of the deposit materials are deposited by reduced pressure chemical vapor deposition (RPCVD). RPCVD is typically performed at below 10 Pa and at temperatures in the range of (550° C.-600° C.). The low pressure used in RPCVD results in a large diffusion coefficient, which leads to growth of a layer that is limited by the rate of surface reactions rather than the rate of mass transfer to the substrate. In RPCVD, reactants can typically be used without dilution. RPCVD is performed, for example, in some embodiments, in a horizontal tube hot wall reactor.

Low Pressure Chemical Vapor Deposition

In some embodiments, one or more layers of the deposit materials are deposited by low pressure chemical vapor deposition (LPCVD) or very low pressure CVD. LPCVD is typically performed at below 1 Pa.

Atmospheric Chemical Vapor Deposition

In some embodiments, one or more layers of the deposit materials are deposited by atmospheric to slightly reduced pressure chemical vapor deposition. Atmospheric pressure to slightly reduced pressure CVD (APCVD) is used, for example, to grow APCVD is a relatively simplistic process that has the advantage of producing layers at high deposition rates and low temperatures (350° C.-400° C.).

Plasma Enhanced Chemical Vapor Deposition

In some embodiments, one or more layers of the deposit materials are deposited by plasma enhanced (plasma assisted) chemical vapor deposition (PECVD). PECVD systems feature a parallel plate chamber operated at a low pressure (e.g., 2-5 Torr) and low temperature (300° C.-400° C.). A radio-frequency-induced glow discharge, or other plasma source is used to induce a plasma field in the deposition gas. PECVD systems that are used include, but are not limited to, horizontal vertical flow PECVD, barrel radiant-heated PECVD, and horizontal-tube PECVD. In some embodiments, remote plasma CVD (RPCVD) is used. Remote plasma CVD is described, for example, in U.S. Pat. No. 6,458,715 to Sano et al., which is hereby incorporated by reference in its entirety.

Anodization

In some embodiments, one or more layers of the deposit materials are deposited by anodization. Anodization is an oxidation process performed in an electrolytic cell. The material to be anodized becomes the anode (+) while a noble metal is the cathode (−). Depending on the solubility of the anodic reaction products, an insoluble layer (e.g., an oxide) results. If the primary oxidizing agent is water, the resulting oxides generally are porous, whereas organic electrolytes lead to very dense oxides providing excellent passivation. See, e.g., Madou et al., 1982, J. Electrochem. Soc. 129, pp. 2749-2752, which is hereby incorporated by reference in its entirety.

Sol-Gel Deposition Techniques

In some embodiments, one or more layers of the deposit materials are deposited by a sol gel process. In a sol-gel process solid particles, chemical precursors, in a colloidal suspension in a liquid (a sol) forms a gelatinous network (a gel). Upon removal of the solvent by heating a glass or ceramic layer. Both sol and gel formation are low temperature processes. For sol formation, an appropriate chemical precursor is dissolved in a liquid, for example, tetraethylsiloxane (TEOS) in water. The sol is then brought to its gel-point, that is, the point in the phase diagram where the sol abruptly changes from a viscous liquid to a gelatinous, polymerized network. In the gel state the material is shaped (e.g., a fiber or a lens) or applied onto a substrate by spinning, dipping, or spraying. In the case of TEOS, a silica gel is formed by hydrolysis and condensation using hydrochloric acid as the catalyst. Drying and sintering at temperatures between 200° C. to 600° C. transforms the gel into a glass and ultimately into silicon dioxide.

In the semiconductor industry the sol-gel method described is often used to deposit silicon dioxide. The method is known as the Spin-On Glass method (SOG). Spin-On Glass materials have been widely used as a diffusion source or a planarizing dielectric or multilevel metalization schemes in the fabrication of nowadays integrated circuits. SOGs are in general Si—O network polymers in organic solvents, and prepared through the hydrolysis-condensation reaction that implied the sol-gel technology. SOG materials can be divided into three groups: 1) silicate based compounds, 2) organosilicon compounds and 3) dopant-organic compounds. More information on SOG can be found, for example, in Nguyen Nhu Toan, Spin-On Glass Materials and Applications in Advanced IC Technologies, 1999, which is hereby incorporated herein by reference in its entirety.

Plasma Spraying Techniques

In some embodiments, one or more layers of the deposit materials are deposited by a plasma spraying process. With plasma spraying, almost any material can be coated on many types of substrates. Plasma spraying is a particle deposition method. Particles, a few microns to 100 microns in diameter, are transported from source to substrate. In plasma spraying, a high-intensity plasma arc is operated between a sticktype cathode and a nozzle-shaped water-cooled anode. Plasma gas, pneumatically fed along the cathode, is heated by the arc to plasma temperatures, leaving the anode nozzle as a plasma jet or plasma flame. Argon and mixtures of argon with other noble (He) or molecular gases ($H_2$, $N_2$, $O_2$, etc.) are frequently used for plasma spraying. Fine powder suspended in a carrier gas is injected into the plasma jet where the particles are accelerated and heated. The plasma jet reaches temperatures of 20,000 K and velocities up to 1000 $ms^{-1}$ in some embodiments. The temperature of the particle surface is lower than the plasma temperature, and the dwelling time in the plasma gas is very short. The lower surface temperature and short duration prevent the spray particles from being vaporized in the gas plasma. The particles in the plasma assume a negative charge, owing to the different thermal velocities of electrons and ions. As the molten particles splatter with high velocities onto a substrate, they spread, freeze, and form a more or less dense coating, typically forming a good bond with the substrate. Plasma spraying equipment is available from Sulzer Metco (Winterthur Switzerland). For more information on plasma spraying, see, for example, Madou, Fundamentals of Microfabrication, Second Edition, 2002, pp. 157-159, CRC Press, which is hereby incorporated by reference in its entirety.

Ink Jet Printing

In some embodiments, one or more layers of the deposit materials are deposited by ink jet printing Ink jet printing is based on the same principles of commercial ink-jet printing. The ink-jet nozzle is connected to a reservoir filled with the chemical solution and placed above a computer-controlled x-y stage. The target object is placed on the x-y stage and, under computer control, liquid drops (e.g., 50 microns in diameter) are expelled through the nozzle onto a well-defined place on the object. Different nozzles print different spots in parallel. In one embodiment of the present disclosure, a bubble jet, with drops as small as a few picoliters, is used to form a layer of a deposit material. In another embodiment, a thermal ink jet (Hewlett Packard, Palo Alto, Calif.) is used to form a layer of a deposit material. In a thermal ink jet, resistors are used to rapidly heat a thin layer of liquid ink. A superheated vapor explosion vaporizes a tiny fraction of the ink to form an expanding bubble that ejects a drop of ink from the ink cartridge onto the substrate. In still another embodiment of the present disclosure, a piezoelectric ink jet head is used for ink jet printing. A piezoelectric ink-jet head includes a reservoir with an inlet port and a nozzle at the other end. One wall of the reservoir consists of a thin diaphragm with an attached piezoelectric crystal. When voltage is applied to the crystal, it contracts laterally, thus deflecting the diaphragm and ejecting a small drop of fluid from the nozzle. The reservoir then refills via capillary action through the inlet. One, and only one, drop is ejected for each voltage pulse applied to the crystal, thus allowing complete control over the when a drop is ejected. In yet another embodiment of the present disclosure, an epoxy delivery system is used to deposit a layer of a device. An example of an epoxy delivery system is the Ivek Digispense 2000 (Ivek Corporation, North Springfield, Vt.). For more information on jet spraying, see, for example, Madou, Fundamentals of Microfabrication, Second Edition, 2002, pp. 164-167, CRC Press, which is hereby incorporated by reference herein in its entirety.

Vacuum Evaporation

In one embodiment of the present disclosure, one or more layers of the deposit materials are deposited by vacuum evaporation. Vacuum evaporation takes place inside an evacuated chamber. The chamber can be, for example, a quartz bell jar or a stainless steel enclosure. Inside the chamber is a mechanism that evaporates the metal source, a wafer holder, a shutter, thickness and rate monitors, and heaters. The chamber is connected to a vacuum pump. There are any number of different ways in which the metal is evaporated within the chamber, including filament evaporation, E-beam gun evaporation, and hot plate evaporation. See, for example, Van Zant, Microchip Fabrication, Fourth Edition, McGraw-Hill, New York, 2000, pp. 407-411, which is hereby incorporated by reference herein in its entirety.

Sputter Deposition/Physical Vapor Deposition

In another embodiment of the present disclosure, one or more layers of the deposit materials are deposited by sputtering. Sputtering, like evaporation, takes place in a vacuum. However, it is a physical not a chemical process (evaporation is a chemical process), and is referred to as physical vapor deposition. Inside the vacuum chamber is a slab, called a target, of the desired film material. The target is electrically grounded. An inert gas such as argon is introduced into the chamber and is ionized to a positive charge. The positively charged argon atoms are attracted to the grounded target and accelerate toward it.

During the acceleration they gain momentum, and strike the target, causing target atoms to scatter. That is, the argon atoms "knock off" atoms and molecules from the target into the chamber. The sputtered atoms or molecules scatter in the chamber with some coming to rest on the wafer. A principal feature of a sputtering process is that the target material is deposited on the wafer with chemical or compositional change. In some embodiments of the present disclosure, direct current (DC) diode sputtering, radio frequency (RF) diode sputtering, triode sputtering, DC magnetron sputtering or RF magnetron sputtering is used. See, for example, Van Zant, Microchip Fabrication, Fourth Edition, McGraw-Hill, New York, 2000, pp. 411-415; U.S. Pat. No. 5,203,977; U.S. Pat. No. 5,486,277; and U.S. Pat. No. 5,742,471, each of which is hereby incorporated by reference herein in its entirety.

RF diode sputtering is a vacuum coating process where an electrically isolated cathode is mounted in a chamber that can be evacuated and partially filled with an inert gas. If the cathode material is an electrical conductor, a direct-current high-voltage power supply is used to apply the high voltage potential. If the cathode is an electrical insulator, the polarity of the electrodes is reversed at very high frequencies to prevent the formation of a positive charge on the cathode that would stop the ion bombardment process. Since the electrode polarity is reversed at a radio frequency, this process is referred to as I33 sputtering. Magnetron sputtering is different form of sputtering. Magnetron sputtering uses a magnetic field to trap electrons in a region near the target surface thus creating a higher probability of ionizing a gas atom. The high density of ions created near the target surface causes material to be removed many times faster than in diode sputtering. The magnetron effect is created by an array of permanent magnets included within the cathode assembly that produce a magnetic field normal to the electric field.

Collimated Sputtering

In another embodiment of the present disclosure, one or more layers of the deposit materials are deposited by collimated sputtering. Collimated sputtering is a sputtering process where the arrival of metal occurs at an angel normal to the wafer surface. The metal is collimated by a thick honeycomb grid that effectively blocks off angle metal atoms in some embodiments. Alternatively, ionizing the metal atoms and attracting them towards the wafer collimates the metal. Collimated sputtering improves filling of high aspect ratio contacts.

Laser Ablated Deposition

In another embodiment of the present disclosure, one or more layers of the deposit materials are deposited by laser ablated deposition. In one form of laser ablated deposition, a rotating cylindrical target surface is provided for the laser ablation process. The target is mounted in a vacuum chamber so that it is rotated about the longitudinal axis of the cylindrical surface target and simultaneously translated along the longitudinal axis. A laser beam is focused by a cylindrical lens onto the target surface along a line that is at an angle with respect to the longitudinal axis to spread a plume of ablated material over a radial arc. The plume is spread in the longitudinal direction by providing a concave or convex lateral target surface. The angle of incidence of the focused laser beam is other than normal to the target surface to provide a glancing geometry in some embodiments. Simultaneous rotation about and translation along the longitudinal axis produce a smooth and even ablation of the entire cylindrical target surface and a steady evaporation plume. Maintaining a smooth target surface is useful in reducing undesirable splashing of particulates during the laser ablation process and thereby depositing high quality thin films. See, for example, U.S. Pat. No. 5,049,405, which is hereby incorporated by reference herein in its entirety.

Molecular Beam Deposition

In another embodiment of the present disclosure, one or more layers of the deposit materials are deposited by molecular beam deposition. Molecular beam deposition is a method of growing films, under vacuum conditions, by directing one or more molecular beams at a substrate. In some instances, molecular beam deposition involves epitaxial film growth on single crystal substrates by a process that typically involves either the reaction of one or more molecular beams with the substrate or the deposition on the substrate of the beam particles. The term "molecular beam" refers to beams of monoatomic species as well as polyatomic species. The term molecular beam deposition includes both epitaxial growth and nonepitaxial growth processes. Molecular beam deposition is a variation of simple vacuum evaporation. However, molecular beam deposition offers better control over the species incident on the substrate than does vacuum evaporation. Good control over the incident species, coupled with the slow growth rates that are possible, permits the growth of thin layers having compositions (including dopant concentrations) that are precisely defined. Compositional control is aided by the fact that growth is generally at relatively low substrate temperatures, as compared to other growth techniques such as liquid phase epitaxy or chemical vapor deposition, and diffusion processes are very slow.

Essentially arbitrary layer compositions and doping profiles are obtained with precisely controlled layer thickness. In fact, layers as thin as a monolayer are grown by MBE. Furthermore, the relatively low growth temperature permits growth of materials and use of substrate materials that could not be used with higher temperature growth techniques. See for example, U.S. Pat. No. 4,681,773, which is hereby incorporated by reference herein in its entirety.

Ionized Physical Vapor Deposition

In another embodiment of the present disclosure, one or more layers of the deposit materials are deposited by ionized physical vapor deposition (I-PVD), also known as ionized metal plasma (IMP). In I-PVD, metal atoms are ionized in an intense plasma. Once ionized, the metal is directed by electric fields perpendicular to the wafer surface. Metal atoms are introduced into the plasma by sputtering from the target. A high density plasma is generated in the central volume of the reactor by an inductively coupled plasma (ICP) source. This electron density is sufficient to ionize approximately 80% of the metal atoms incident at the wafer surface. The ions from the plasma are accelerated and collimated at the surface of the wafer by a plasma sheath. The sheath is a region of intense electric field that is directed toward the wafer surface. The field strength is controlled by applying a radio frequency bias.

Ion Beam Deposition

In another embodiment of the present disclosure, one or more layers of the deposit materials are deposited by ion beam deposition (IBD). IBD uses an energetic, broad beam ion source carefully focused on a grounded metallic or dielectric sputtering target. Material sputtered from the target deposits on a nearby substrate to create a film. Most applications also use a second ion source, termed an ion assist source (IAD), which is directed at the substrate to deliver energetic noble or reactive ions at the surface of the growing film. The ion sources are "gridded" ion sources and are typically neutralized with an independent electron source. IBD processing yields excellent control and repeatability of film thickness and properties. Process pressures in IBD systems are approximately 10-4 Torr. Hence, there is very little scattering of either ions delivered by the ion sources or material sputtered from the target of the surface. Compared to sputter deposition using magnetron or diode systems, sputter deposition by IBD is highly directional and more energetic. In combination with a substrate fixture that rotates and changes angle, IBD systems deliver a broad range of control over sidewall coatings, trench filling and liftoff profiles.

Atomic Layer Deposition

In another embodiment of the present disclosure, one or more layers of the deposit materials are deposited by atomic layer deposition. Atomic layer deposition is also known as atomic layer epitaxy, sequential layer deposition, and pulsed-gas chemical vapor deposition. Atomic layer deposition involves use of a precursor based on self-limiting surface reactions. Generally, an object is exposed to a first species that deposits as a monolayer on the object. Then, the monolayer is exposed to a second species to form a fully reacted layer plus gaseous byproducts. The process is typically repeated until a desired thickness is achieved. Atomic layer deposition and various methods to carry out the same are described in U.S. Pat. No. 4,058,430 to Suntola et al., entitled "Method for Producing Compound Thin Films," U.S. Pat. No. 4,413,022 to Suntola et al., entitled "Method for Performing Growth of Compound Thin Films," to Ylilammi, and George et al., 1996, J. Phys. Chem. 100, pp. 13121-13131, each of which is hereby incorporated by reference herein in its entirety. Atomic layer deposition has also been described as a chemical vapor deposition operation performed under controlled conditions that cause the deposition to be self-limiting to yield deposition of, at most, a monolayer. The deposition of a monolayer provides precise control of film thickness and improved compound material layer uniformity. Atomic layer deposition is performed using equipment such as the Endura Integrated Cu Barrier/Seed system (Applied Materials, Santa Clara, Calif.).

Hot Filament Chemical Vapor Deposition

In another embodiment of the present disclosure, one or more layers of the deposit materials are deposited by hot filament chemical vapor deposition (HFCVD). In HFCVD, reactant gases are flowed over a heated filament to form precursor species that subsequently impinge on the substrate surface, resulting in the deposition of high quality films. HFCVD has been used to grow a wide variety of films, including diamond, boron nitride, aluminum nitride, titanium nitride, boron carbide, as well as amorphous silicon nitride. See, for example, Deshpande et al., 1995, J. Appl. Phys. 77, pp. 6534-6541, which is hereby incorporated by reference herein in its entirety.

Screen Printing

In another embodiment of the present disclosure, one or more layers of the deposit materials are deposited by a screen printing (also known as silk-screening) process. A paste or ink is pressed onto portions of an underlying structure through openings in the emulsion on a screen. See, for example, Lambrechts and Sansen, Biosensors: Microelectrochemical Devices, The Institute of Physics Publishing, Philadelphia, 1992, which is hereby incorporated by reference in its entirety. The paste consists of a mixture of the material of interest, an organic binder, and a solvent. The organic binder determines the flow properties of the paste. The bonding agent provides adhesion of particles to one another and to the substrate. The active particles make the ink a conductor, a resistor, or an insulator. The lithographic pattern in the screen emulsion is transferred onto portions of the underlying structure by forcing the paste through the mask openings with a squeegee. In a first step, paste is put down on the screen. Then the squeegee lowers and pushes the screen onto the substrate, forcing the paste through openings in the screen during its horizontal motion. During the last step, the screen snaps back, the thick film paste that adheres between the screening frame and the substrate shears, and the printed pattern is formed on the substrate. The resolution of the process depends on the openings in the screen and the nature of the paste. With a 325-mesh screen (i.e., 325 wires per inch or 40 µM holes) and a typical paste, a lateral resolution of 100 µM can be obtained.

For difficult-to-print pastes, a shadow mask, such as a thin metal foil with openings, complements the process. However, the resolution of this method is inferior (>500 µM). After printing, the wet films are allowed to settle for a period of time (e.g., fifteen minutes) to flatten the surface while drying. This removes the solvents from the paste. Subsequent firing burns off the organic binder, metallic particles are reduced or oxidized, and glass particles are sintered. Typical temperatures range from 500° C. to 1000° C. After firing, the thickness of the resulting layer ranges from 10 µM to 50 µM. One silk-screening setup is the DEK 4265 (Universal Instrument Corporation, Binghamton, N.Y.). Commercially available inks (pastes) that can be used in the screen printing include conductive (e.g., Au, Pt, Ag/Pd, etc.), resistive (e.g., $RuO_2$, $IrO_2$), overglaze, and dielectric (e.g., $Al_2O_3$, $ZrO_2$). The conductive pastes are based on metal particles, such as Ag, Pd, Au, or Pt, or a mixture of these combined with glass. Resistive pastes are based on $RuO_2$ or $Bi_2Ru_2O_7$ mixed with glass (e.g., 65% PBO, 25% $SiO_2$, 10% $Bi_2O_3$).

The resistivity is determined by the mixing ratio. Overglaze and dielectric pastes are based on glass mixtures. Different melting temperatures can be achieved by adjusting the paste composition. See, for example, Madou, Fundamentals of Microfabrication, Second Edition, CRC Press, Boca Raton, Fla., 2002, pp. 154-156, which is hereby incorporated by reference herein in its entirety.

Electroless Metal Deposition

In another embodiment of the present disclosure, one or more layers of the deposit materials are deposited by electroless metal deposition. In electroless plating a layer is built by chemical means without applying a voltage. Electroless plating baths can be used to form Au, Co—P, Cu, Ni—Co, Ni—P, Pd, or Pt layers. See, for example, Madou, Fundamentals of Microfabrication, Second Edition, CRC Press, Boca Raton, Fla., 2002, pp. 344-345, which is hereby incorporated by reference herein in its entirety.

Electroplating

In another embodiment of the present disclosure, one or more layers of the deposit materials are deposited by electroplating. Electroplating takes place in an electrolytic cell. The reactions that take place in electroplating involve current flow under an imposed bias. In some embodiments, a layer is deposited as part of a damascene process. See, for example, Madou, Fundamentals of Microfabrication, Second Edition, CRC Press, Boca Raton, Fla., 2002, pp. 346-357, which is hereby incorporated herein by reference in its entirety.

Lithographic Etching Methods

The following subsections describe lithographic etching techniques that can be used in the fabrication methods described above. One of skill in the art will appreciate that etching or patterning the substrate can be conducted using other methods including, but not limited to, direct write technologies, Block Copolymer techniques and frequency doubling techniques.

Cleaning and Dehydration Baking

In some embodiments in accordance with the present disclosure, the fabrication methods begin with a cleaning process. Substrate cleaning is an important step in a lithographic process if there is contamination in presence, as the contamination can severally compromise the adhesion of the resist to the substrate. Substrate surfaces have four general types of contamination: particulates, organic residues, inorganic residues, and unwanted oxide layers. Depending on the substrate and the type of contaminants, several cleaning techniques can be used. These methods include dry cleaning, wet cleanings, ultrasonic agitation, polishing with abrasive compounds, supercritical cleaning.

In some embodiments, a wet cleaning is used to remove organic materials from the substrate and prepare for the adhesion of the resist to the substrate. It is carried out by submerging a substrate in a bath or by rinsing the substrate with DI water and/or a solvent rinse. After the wet cleaning, the substrate is dried to remove moistures. Several drying techniques can be used. For example, in some embodiments, the substrate after wet cleaning can be dried using dehydration bake method. In this method, the substrate is baked at a temperature for a period of time such as baked at 80° C. for several minutes. In some embodiments, the substrate may be dried by $N_2$ flow or spinning More detailed information with regard to cleaning and drying of a substrate can be found, for example, in Van Zant, Microchip Fabrication, Forth Edition, McGraw-Hill, New York, 2000, pp. 87-131, which is hereby incorporated by reference herein in its entirety.

Adhesion Promotion Coating

To further improve the adhesion of the resist to the substrate, an adhesion promoter can be applied to the substrate before the application of the resist. Depending on the substrate and the resist, various adhesion promoters can be used. In some embodiments, Bis(trimethylsilyl)amine (also known as hexamethyldisilazane, or HMDS) or other organic materials are chosen as the adhesion promoter for the fabrication processes described in the present application.

HMDS is an organosilicon compound with the molecular formula $RCH_3)_3SihNH$. The molecule is a derivative of ammonia with trimethylsilyl groups in place of two hydrogen atoms. This colorless liquid is a reagent and a precursor to bases that are popular in organic synthesis and organometallic chemistry. In photolithography, HMDS is often used as an adhesion promoter for photoresist, and can be applied using any suitable conventional methods. For example, HMDS can be applied by vapor chemical deposition. In general, good adhesions are obtained by applying HMDS from the gas phase on heated substrates.

Bottom Anti-Reflective Coating

Optionally, a bottom anti-reflective coating (BARC) may be applied to help reduce image distortions associated with light reflections during lithography. In some cases, BARCs are critical and highly desirable. For example, when the substrate or a layer on the substrate is highly reflective, as in metal and polysilicon layers, light reflections can destroy the pattern resolution by three mechanisms: a) off-normal incident light can be reflected back through the resist that is intended to be masked; b) incident light can be reflected off device features and expose "notches" in the resist; and c) thin-film interference effects can lead to linewidth variations when resist thickness changes are caused by substrate or wafer topology or nonflatness.

BARCs can be either organic or inorganic, and can be applied either before or after the photoresist. Conventional methods, such as spinning, sputtering or chemical vapor deposition, can be used to apply the BARCs. By reducing standing waves, thin-film interference, or specular reflections, a BARC helps shrink line widths and improves the pattern resolution. In some cases, a BARC can absorb the radiation and dissipates the energy as heat. Such a BARC is generally suitable to be applied to a substrate before the resist. This BARC lowers reflectance back into the photoresist that has passed through the photoresist.

Resist Properties

One form of photolithographic processing in accordance with the present disclosure begins with the coating of a resist layer over the layer of material to be patterned. Another form of photolithographic processing in accordance with the present disclosure applies the resist coating after at least one of the steps described in the previous sections, i.e., cleaning and dehydration baking, adhesion promotion coating or BARC. Resists used to form this resist layer are typically comprised of organic polymers applied from a solution. In some embodiments, the thickness of the resist is determined using Bossung Curve analysis. Bossung Curve analysis is one of the most commonly used tools in lithography. It maps a control surface for critical dimensions as a function of the variables of focus and exposure (dose). A detailed discussion of the Bossung Curve analysis can be found in Zavecz, Metrology, Inspection and Process Control edited by C. Archie, Proceeding of SPIE (2006) Vol. 6152-109.

In some embodiments, this resist layer has a thickness in the range of 0.1 µm to 2.0 µm. Furthermore, in some embodiments, the resist layer has a uniformity of plus or minus 0.01 µm. In some embodiments, the resist layer is applied using a spin technique such as a static spin process or a dynamic dispense process. In some embodiments, the resist layer is applied using a manual spinner, a moving-arm resist dispenser, or an automatic spinner. See, for example, Van Zant, Microchip Fabrication, Forth Edition, McGraw-Hill, New York, 2000, pp. 217-222, which is hereby incorporated by reference herein in its entirety.

Negative resists. In some embodiments, the resist layer is an optical resist that is designed to react with ultraviolet or laser sources. In some embodiments, the resist layer is a negative resist in which polymers in the resist form a cross-linked material that is etch resistant upon exposure to light. Examples of negative resists that can be used to make the resist layer include, but are not limited to, azidelisoprene negative resists, polymethylmethacrylate (PMMA), polymethylisopropyl ketone (PMIPK), poly butene-1-sulfone (PBS), poly-(trifluoroethyl chloroacrylate) TFECA, copolymer (V-cyano ethyl acrylate-V-amido ethyl acrylate) (COP), poly-(2-methyl pentene-1-sulfone) (PMPS) and the like.

Positive resists. In other embodiments, the resist layer (e.g., positive resist layer of FIG. 2A) is a positive resist. The positive resist is relatively insoluble. After exposure to the proper light energy, the resist converts to a more soluble state. This reaction is called photosobulization. One positive photoresist in accordance with the present disclosure is the phenol-formaldehyde polymer, also called phenol-formaldehyde novolak resin. See, for example, DeForest, Photoresist: Materials and Processes, McGraw-Hill, New York, 1975, which is hereby incorporated by reference herein in its entirety. In some embodiments, the resist layer is LOR OSA, LOR 5 0.7A, LOR 1A, LOR 3A, or LOR 5A (MICROCHEM, Newton, Mass.). LOR lift-off resists use polydimethylglutarimide.

Soft Baking

After the resist layer has been applied, the density is often insufficient to support later processing. And some solvent may inhibit the exposure curve. Accordingly, in some embodiments of the present disclosure, a bake is used to densify the resist layer and drive off residual solvent or excess carrier solvent from the resist layer. After the bake, the resist becomes less tacky and the thickness of the resist layer is reduced slightly. This bake is referred to as a softbake, prebake, or post-apply bake. Several methods of baking the resist layer are contemplated by the present disclosure including, but not limited to, convection ovens, infrared ovens, microwave ovens, or hot plates. See, e.g, Levinson, Principles of Lithography, SPIE Press, Bellingham, Wash., 2001, pp. 68-70, which is hereby incorporated by reference herein in its entirety.

Alignment and Exposure of the Mask

After the spacer has been coated with a resist layer, the next step is alignment and exposure of the resist layer. Alignment and exposure is, as the name implies, a two-purpose photomasking step. The first part of the alignment and exposure step is the positioning or alignment of the required image on the material surface. The image is found on a mask. The second part is the encoding of the image in the resist layer from an exposing light or radiation source. In the present disclosure, any conventional alignment system can be used to align the mask with the resist layer, including but not limited to, contact aligners, proximity aligners, scanning projection aligners, steppers, step and scan aligners, x-ray aligners, and electron beam aligners. For a review of aligners that can be used in the present disclosure, see, e.g., Solid State Technology, April 1993, p. 26; and Van Zant, Microchip Fabrication, Fourth Edition, McGraw-Hill, New York, 2000, pp. 232-241, each of which in incorporated herein by reference in its entirety. Masks can be negative or positive.

A positive mask (not shown) used to develop a positive resist would have the opposite pattern of a negative mask. Both negative masks and positive masks used in the methods of the present disclosure are fabricated with techniques similar to those used in wafer processing. A photomask blank, consisting of an opaque film (usually chromium) deposited on glass substrates, is covered with resist. The resist is exposed according to the desired pattern, is then developed, and the exposed opaque material etched. Mask patterning is accomplished primarily by means of beam writers, which are tools that expose mask blanks according to suitably formatted biosensor electrode patterns. In some embodiments, electron or optical beam writers are used to pattern negative masks or positive masks. See, e.g., Levison, Principles of Lithography, SPIE Press, Bellingham, Wash., 2001, pp. 229-256, which is hereby incorporated by reference herein in its entirety.

Exposing the resist to light breaks or forms chemical bonds in the resist layer. The final image matches the desired pattern from the mask or interference pattern. In various embodiments, attention is focused on providing uniformity of the light intensity and/or controlling the exposure rate.

In one embodiment of the present disclosure, the tool used to project the pattern of a mask onto a device is a wafer stepper. Wafer steppers exist in two configurations, step-and-repeat and step-and-scan. In a step-and-repeat system, the entire area of the mask to be exposed is illuminated when a shutter is opened. In a step- and scan system, only part of the mask, and therefore only part of the exposure field on the device unit, is exposed when a shutter is opened. The entire field is exposed by scanning mask and the device being patterned synchronously. See, e.g., Levison, Principles of Lithography, SPIE Press, Bellingham, Wash., 2001, pp. 133-174, which is hereby incorporated by reference herein in its entirety.

Post Expose Bake

Before developing the resist, a post exposure bake (PEB) is optionally performed after exposure. In some cases where high resolutions are not required, the PEB is not necessary. However, for certain resists or for high resolutions, a PEB is inevitable for the crosslinking induced by the exposure.

PEB can be applied above the softening point of the resist without destroying the structures to be developed. For example, a PEB can be performed at 110° C., for 1-2 min on a hotplate. A PEB performed near the softening point of the photo resist can reduce mechanical stress formed during softbake and exposure. A PEB can also promote the thermally activated diffusion of carboxylic acid formed during exposure from the photo active compound. This diffusion step smoothes the spatial periodic pattern of carboxylic acid, which in turn will help to improve the image or pattern resolution.

Development

After exposure through a mask, the pattern is coded as a latent image in resist as regions of exposed and unexposed resist. The pattern is developed in the resist by chemical dissolution of the unpolymerized resist regions. A number of development techniques can be used to develop the resist. Development techniques are designed to leave in the resist layer an exact copy of the pattern that was on the mask or reticle. The successful development of the image coded in resist is dependent on the nature of the resist's exposure mechanisms.

Negative resist, upon exposure to light, goes through a process of polymerization which renders the resist resistant to dissolution in the developer chemical. The dissolving rate between the two regions is high enough so that little of the layer is lost from the polymerized regions. The chemical preferred for many negative-resist-developing situations is xylene or Stoddart solvent. The development step is done with a chemical developer followed by a rinse. For negative resists, the rinse chemical is n-butyl acetate in some embodiments.

Positive resists present a different developing condition. The two regions, polymerized and unpolyrnerized, have a different dissolving rate. This means that during the developing step some resist is always lost from the polymerized region. Use of developers that are too aggressive or that have overly long developing times result in an unacceptable thinning of the resist. Two types of chemical developers used with positive resists in accordance with the present disclosure are alkaline-water solutions and nonionic solutions. The alkaline-water solutions can be sodium hydroxide or potassium hydroxide. Typical nonionic solutions include, but are not limited to, tetramethylamrnonimurn hydroxide (TMAH). The rinse chemical for positive-resist developers is water. A rinse is used for both positive and negative resists. This rinse is used to rapidly dilute the developer chemical to stop the developing action.

There are several methods in which a developer is applied to resist in order to develop the latent image. Such methods include, but are not limited to, immersion, spray development, and puddle development. In some embodiments of the present disclosure, wet development methods are not used. Rather, a dry (or plasma) development is used. In such dry processes, a plasma etcher uses energized ions to chemically dissolve away either exposed or unexposed portions of the resist layer without first developing the resist layer using wet chemical techniques.

In some embodiments, in particular when an organic compound is used as the photoresist, the chemical reaction in the resist layer needs to be controlled to ensure the image fidelity. This can be achieved by controlling the exposure time, the development time, or other processing parameters. Image fidelity herein refers to the ability of a lithographic process to render an image accurately, without any visible distortion or information loss.

Hard Baking

In some embodiments of the present disclosure, resist is hard baked after it has been developed. The purpose of the hard bake is to achieve good adhesion of the resist layer to the underlying layer to be patterned. In some embodiments, a hard bake is accomplished using a convection oven, in-line or manual hot plates, infrared tunneling ovens, moving-belt convection ovens, vacuum ovens and the like. General baking temperature and baking times are provided by the resist manufacture. Therefore, specific baking temperatures and times is application dependent. Usually the hard baking temperature is the hottest or highest temperature among all of the processes. Nominal hard bake temperatures are from 130° C. to 200° C. for thirty minutes in a convection oven. The hard baking sets the resist and enhances mechanical stability of the resist for the subsequent etch or implant process. At this point, the image fidelity is usually measured and fed back to the preceding lithographic steps.

Etching

After development, an etching step is used for patterning. A number of etching methods are available. Etching can be divided into dry and wet etching. The following disclosure provides examples of such etching. It will be understood by one of skill in the art that the disclosed etching methods can be used independently of the preceding lithographic steps in accordance with some embodiments. It will be further understood by one of skill in the art that the disclosed etching methods can be used with the preceding lithographic steps in accordance with some embodiments. Wet etching is the use of acidic or basic solutions to solvate away a specific reacted species. Examples are silicon dioxide being etched in hydrofluoric acid, or $Si_3N_4$ in hot phosphoric acid, or mono-crystalline silicon in potassium hydroxide (KOH)). Photoresist materials are removed by acid or base materials (depending on polarity and resist chemistry).

The following list is a generic categorization of the classifications of etches methods. Each etch method has specialized equipment for optimization of the process. Complexity has evolved to the point where some of the terms and techniques are interchangeable. For example, there are terms depending on the vendor, for inductive coupled plasma (ICP) etch or transformer coupled plasma (TCP), each which improves an ion etcher.

Wet Etching.

In wet etching, etchant is introduced either as a liquid bath with submersion or a surface spray/mist. Material is removed as a function of solvation of the etch intermediate or byproduct. A limitation of wet etching is the wetting function of the chemical. Some etchants are two step reactions such as oxidation of a material then solvation of the oxide.

Wet etches can also be used in combination with the dry etches as a preparatory step for surface cleaning or contaminate removal. An example is organic material removal prior to a reactive ion etch. Wet etches are isotropic or follow crystal lattices.

In one embodiment of the present disclosure, the structure to be patterned is immersed in a tank of an etchant for a specific time. Then the structure is transferred to a rinse station for acid removal, and transferred to a station for final rinse and a spin dry step.

Wet spray etching or vapor etching. In some embodiments of the present disclosure, wet spray etching or vapor etching is used for patterning. Wet spray etching offers several advantages over immersion etching including the added definition gained from the mechanical pressure of the spray. In vapor etching, the wafer is exposed to etchant vapors such as hydroflowic acid vapors.

Dry Etching—Reactive-Ion Etching

Dry etching encompasses other methods outside the wet etch environment. Basic mechanics includes excitation of a chemical to an ionic state and then reaction with the substrate and films. Material is removed either by physical/mechanical methods or chemical conversion and solvation into the gas stream.

Sputter (physical/mechanical). In sputter approaches, ions or elements are accelerated to a high energy and directed toward a surface. Surfaces are removed due to the collisions of these highly charged ions, much like a nanoscale sandblasting method. Sputter etching is facilitated by charging the ion and then establishing a high bias towards to the substrate. Removal is line of sight from the target in the direction of the bias. Sputter etching is a method to achieve anisotropic etch profiles. Sputtering can also be accomplished by directional ion bombardment by 'ion guns'. Examples include focused ion beam (FIB) or other direct write approaches.

Chemical (solvation—liquid or gas). Chemical enhanced etching exploits generation of intermediate species that can be solvated in the solution or vaporized in the low pressure chamber. Chemical etching is tuned to generate the solvated states due to the chemicals included in the reaction mixture. For example, chlorine is used for most metals. A fluorine based chemical such as carbontetrafluoride ($CF_4$) or sulfurfluoride ($SF_6$) is used for etching silicon or silicon oxide. Oxide etches with $CF_4$ or $SF_6$ follows the same reaction mechanism as the wet etch with HF acid.

Chemical etch is more isotropic in nature than the corresponding sputtering systems. A technique of alternating and combining the two methods can sculpt complex side wall profiles. The present disclose encompasses the use of such methods to generate the specific nodes for functionality. An example is the 'wine glass' structure disclosed FIG. 7 of related application No. 61/802,006, filed Mar. 15, 2013, which is hereby incorporated by reference herein for its disclosure of such structures.

Ion beam etching. Another type of etcher that is used to perform the etching of spacer 140 in accordance with various aspects of the present disclosure is ion beam etching. Unlike chemical plasma systems, ion beam etching is a physical process. The structure to be etched is placed on a holder in a vacuum chamber and a stream of argon is introduced into the chamber. Upon entering the chamber, the argon is subjected to a stream of high-energy electrons from a set of cathode (−)-anode (+) electrodes. The electrons ionize the argon atoms to a high-energy state with a positive charge. The wafers are held on a negatively grounded holder that attracts the ionized argon atoms. As the argon atoms travel to the wafer holder they accelerate, picking up energy. At the wafer surface, they crash into the exposed wafer layer and blast small amounts from the wafer surface. No chemical reaction takes place between the argon atoms and the wafer material. The material removal (etching) is highly directional (anisotropic), resulting in good definition in small openings.

Plasma etching. Plasma generation is a method for ionization in the dry etch process. Plasmas can be tuned and controlled for the different gases used. Plasma can be struck with one gas and maintained by another. Relative location of the plasma can increase etch rate or impact resultant damage. Some systems apply remote plasma generation sources while others control the confinement and immersion in the plasma. Generally there is a dilution or carrier gas that maintains the plasma and then a small volume of reactive gas is introduced. Vacuum levels define the type of plasma etching and complexity for control. Power of the generator is a control factor as well as the frequency.

In some embodiments, plasma etching is performed using a plasma etcher. Physically, a plasma etcher comprises a chamber, vacuum system, gas supply, and a power supply. The structure to be etched is loaded into the chamber and the pressure inside is reduced by the vacuum system. After the vacuum is established, the chamber is filled with the reactive gas. For the etching of silicon dioxide, for example, the gas is usually $CF_4$ that is mixed with oxygen. A power supply creates a radio frequency (RF) field through electrodes in the chamber. The field energizes the gas mixture to a plasma state. In the energized state, the fluorine attacks the silicon dioxide, converting it into volatile components that are removed from the system by the vacuum system.

Any of a wide variety of plasma etchers is used to perform etching, in accordance with various embodiments of the present disclosure. Such etchers include, but are not limited to, barrel etchers, plasma planar systems, electron cyclotron resonance sources, high density reflected electron sources, helicon wave sources, inductively coupled plasma sources, and transformer coupled plasma sources.

In some embodiments, a reactive ion etcher system combines plasma etching and ion beam etching principles. The systems are similar in construction to the plasma systems but have a capability of ion milling. The combination brings the benefits of chemical plasma etching along with the benefits of directional ion milling. See, e.g., Van Zant, Microchip Fabrication, Fourth Edition, McGraw-Hill, New York, 2000, pp. 256-270, which is hereby incorporated herein by reference for more information on etching techniques and etching equipment that can be used in accordance with the present disclosure.

Characteristics of an Etch Process.

The etch process generates an artifact or signature of the processing employed. Knowledge of how to apply etching methods determines the final profile of the structure. Definitions for the following terms are provided in order to convey an understanding of the etch processing characteristics.

Isotropic etching. Isotropic implies equal etching in all directions. The two references are vertical and horizontal directions. An isotropic etch 'undercuts' the mask at a ratio to the vertical depth etched. Impact is that a circular opening of 1 micron when etched to a 0.5 micron depth would have a bowl like shape that is 2 microns at the top of the bowl, 1 micron at the bottom, with rounded side walls. An important consideration here is that if a conformal film were deposited over a topography/structure, an isotropic etch would remove the horizontal material as well as the side wall/vertical material. There is no shadowing or off line of sight protection from an isotropic etch (excluding rate limiting or aspect ratio physical diffusivity barriers). This characteristic is used in cleans and sacrificial film removals. One trick is to use isotopic etching to consume the side walls, thereby reducing the critical dimension.

Anisotropic etching. Anisotropic etching is preferential etching in one direction over the other. Hence the term anisotropic: not isotropic. Ability to produce anisotropic etch chemistries allows for denser packing of devices. Anisotropy is limited by the bias and directionality of the tool utilized. The mask image is transferred into the substrate with fidelity: a 1 micron circular opening etched to 0.5 micron depth is 1 micron by 0.5 micron feature in the substrate.

An application for the disclosed technology is considering the etching of a conformal coating. If the deposited film is 0.25 microns over a 0.8 micron step, an anisotropic etch removes the 0.25 microns on the surface (horizontal surface) but leaves the side wall (vertical surface) material. Thereby an anisotropic etch results in a new structure of the deposited material where an isotropic etch would remove all material. Limitations on anisotropic etches are physical limitations that inhibit reactive species reaching the bottom surface of the etch location. These topics are defined in 'aspect ratio', 'poisoning', 'etch stops' and other terms below.

Etching Definitions and Examples

Etch rate—A function of the process recipe which quantifies how fast a material is removed. Units are expressed in removed thickness per time, e.g. Angstroms per second. Etch rate includes lateral calculation as well as the vertical component. Etch rate can be reduced by addition of diluents or carrier gases that do no enhance the etch reaction. Etch rate is modified to compensate for reaction chamber design where the etch rate in the center may be higher than on the outer edge. Etch rate is sacrificed for uniformity and repeatability. High etch rates are desirable for manufacturability. However, etch rate is only one part of the grand compromise for a final etch process.

Selectivity—A comparative etch rate ratio of the desired material to be etched and the protective mask material (ratio of material etch rate over mask etch rate). A high selectivity is desired to maintain transfer of the lithography into the substrate. If the selectivity is low the differentiation between starting structure and final structure is compromised due to loss of mask. Etch chemistries are adjusted to achieve the highest selectivity possible without compromising process time for the material etch rate. High selectivity with an Angstrom per hour etch rate is not practical in typical embodiments.

Side wall slope—A desired etch profile could be a perfect transfer of the mask image into the substrate material with vertical sidewalls. The most common etch artifact is an oblique angle slope where the top is wider than the bottom. This can be caused from various etch conditions. A primary mechanism for this is that the etch reaction is hindered by diffusivity of the etchant, by-product interference, loss of ionization states, or competitive nonproductive reactions. In the instant disclosure, both vertical side wall, oblique and re-entry angled structures are contemplated through the disclosed etching techniques.

Re-entrant Side wall—The opposite of the oblique angle side wall is the re-entrant side wall angle. Here the bottom is wider than the top masked surface. This profile can be obtained by segmented etching with increasingly isotropic etch recipes. The isotropic undercuts by the lateral etch nature. The resultant structure resembles the dove tail joint in wood working. Another method for reentrant side walls is the enhancement of the etch rate in the trench as a function of dopant materials.

Inhibitor Sidewall protection due to byproduct re-deposition. Another control method for side wall profile is due to the nature of the etchant reaction. The etch reaction may generate a by-product that is not highly volatile. These compounds redeposit on the side wall during the reaction. In an isotropic etch it stops the lateral etch at the top but does not hinder at the bottom area. Re-deposition is viewed as both a positive and negative aspect of the process. Such re-deposition is advantageously used in the present disclosure.

Erosion. A method to increase the oblique slope of a side wall during an etch process is to erode the masking material at the edges. This is usually a function of heating the mask material during the etch process. This has the impact that the edge acuity of the resist is lost, resulting in the feature size being gradually reduced with etch time. Resist erosion reduces the critical dimension at the top of the feature. Examples of extreme erosion would produce teepee or pyramid like structures Etch Stop. An etch stop material is a material that has a very low etch rate that is built as a sandwich structure in a device. As the target material is etched the structure is defined. However when the etchant hits the etch stop material the maximum depth is reached. This is a method to control the depth of an etch material with high precision. Deposition sandwich can be controlled uniformly across the substrate regardless of the etch reactor design or non uniformity. A second artifact is that the amount of over etch time can be extended and only the lateral etch will continue. Lateral etch results in re-entrant slopes or critical dimension reduction.

Self limiting or poisoning. An etch recipe can be designed in which there is a limitation of the etchant material. Then due to physical constraint such as aspect ratio, dilution, power or bias, the effective etch is restricted. Evidence of this artifact is in deep trench, 10 to 15 microns, where there is tapering and closure. Regardless of the additional time provided the etch depth does not progress. Poisoning of the reaction has the same results but can be observed by additions to the gas stream that inhibits conversion to the desired species, or a competitive reaction that consumes the reactive species in a nonproductive reaction.

Crystalline specific (lattice orientation). For mono crystalline or highly ordered lattice structures, etchants can be used to highlight and accentuate the lattice structure. For example, iodine based wet etches are used for defect analysis due to different etch rates on the crystal lattice. In some embodiments, crystalline specific etches for special substrate enhancements and for specific devices are used. In some embodiments, metallic etches can improve the surface area for the graphene growth. Moreover, nucleation approaches make use of faceting etch for graphene growth.

Secondary Etch Functions and Utilization

The following provides additional uses for the disclosed etching processes that are used in accordance with some embodiments of the present disclosure.

Cleaning. Etch removal of contaminates accumulated during previous processing steps can be performed. Examples of a standard etch clean process such as the RCA Clean is 1) application of distilled water, 2) application of buffered ammonium hydroxide, 3) application of dilute HF for ancient oxide, and 4) application of HCl for metallic clean. Clean procedures can also be plasma based prior to a deposition process. A clean process is removing the unwanted films prior to the following step. Cleans can be before etch steps (remove inhibitors), deposition and lithography.

Polish. A light etch step to change the profile slightly or remove unwanted residuals. For segmented film deposition a slight polish removes undesired side wall material and fine tunes by reduction of material the final film thickness.

Structure definition. Previous discussion highlighted the side wall slope as nominal/vertical, oblique, or reentrant angled. Functional nodes can be sculpted in the profile by tuning the etch process. A simple example is the wine glass structure which was designed for metal flow into contact views. As the structures became more complex such as for plasmonics, nodes are defined by crevices or protrusion. Full structures such as a rib or ribbon can be generated by an anisotropic etch of a conformally deposited film. These concepts are captured in our portfolio as related to side walls, segmented film deposition, or fine structure lithography to name a few.

Deep trench and isolation of structures. State of the art technologies have advanced to do deep trench etches with aspect ratios of 20:1 to greater. One of the benefits of trench formation is the ability to isolate structures on the same substrate. The isolation can be by air or a back fill material (dielectric or oxides). The etch process defines the isolation and the resultant critical dimension of the rib or pillar. Polarity is important because the device functionality can be buried in the bottom of the trench and the wall portions can act as thermal radiators, wave guides, or particulate traps.

Aspect ratios. Aspect ratio is defined by the height of the structure over the width. In the etch process this impacts the diffusivity of the etchant in a narrow trench (10:1) which will slow the etchant reaction. A secondary concern is the physical stability of a tall feature on a narrow base. Such features are impacted by the microfluidic forces of subsequent processing resulting in toppling or cleavage of the structure.

Side wall deposition. Depending on the application and process engineering this can be a benefit or a detriment. The majority of re-deposition material during an etch process is difficult to remove with later steps (especially metal halides) which is a detriment. The rate of re-deposition can impact the profile of the structure. A benefit of re-deposition is an organic re-deposition or interaction with the photo resist that maintains the resist mask and image fidelity. This re-deposition is a corrective action for undesired resist erosion. Another example of re-deposition being beneficial is when the byproduct material can be formed for a device functionality or structure.

Etch passivation. Slight differentiation, or subset of side wall re-deposition. During an etch step and oxidizing ambient may be used as the etchant chemistry. If there are other layers exposed such as metals (aluminum) a thin oxide will be formed which passivates the secondary surface. Other etch byproducts passivates other materials.

Tool Types

The present disclosure encompasses the use of a wide variety of etch tool configurations. Manufactures of such tools include, but are not limited to, Applied materials, Lam Research, Tegal, Hitachi, Oxford, Plasma Therm, and Branson to name a few. Each company has improvements or enhancements over the competitors. The following list highlights some of the designs and types of reactors on the market: barrel etchers, parallel plate, downstream etchers, ICP, TCP, sinks, spray dispense, oxidation, EBEAM oxidation, and direct write systems. For wet etch (wet sinks) there are numbers of designs for recirculation, purity, automation of multiple baths and inclusion of spin rinse dryers. Note also in the literature some tools are refined to the substrate or material designed to be etched: metal etchers, oxide etchers, etc.

Residual Layer Removal

The result of the etching process described above is the formation of grooves. Next, the residual layer is removed in a process known as resist stripping in order to yield the patterned structure. In some embodiments, the resist is stripped off with a strong acid such as $H_2SO_4$ or an acid oxidant combination, such as $H_2SO_4$—$Cr_2O_3$, attacking the resist but not the groove to yield the fully patterned structure. Other liquid strippers include organic solvent strippers (e.g., phenolic organic strippers and solventlamine strippers) and alkaline strippers (with or without oxidants). In some embodiments of the present disclosure, a dry plasma process is applied to remove a resist. In such embodiments, the device is placed in a chamber and oxygen is introduced. The plasma field energizes the oxygen to a high energy state, which, in turn, oxidizes the resist components to gases that are removed from the chamber by the vacuum pump. In dry strippers, the plasma is generated by microwave, radio frequency, or ultraviolet-ozone sources. More information on photolithographic processes that can be used to pattern devices is found in Madou, Fundamentals of Microfabrication, Second Edition, CRC Press, Boca Raton, Fla., 2002, pp. 2-65; Van Zant, Microchip Fabrication, Fourth Edition, McGraw-Hill, New York, 2000, Wolf and Tauber, Silicon Processing for the VLSI Era, Second Edition, Lattice Press, Sunset Beach, Calif., 2002; and SZE and Ng, Physics of Semiconductor Devices, Third Edition, Wiley-Interscience, 2007, each of which are hereby incorporated by reference herein in their entireties. Such methods include the use of a positive photoresist rather than a negative photoresist as well as extreme ultraviolet lithography, x-ray lithography, charged-particle-beam lithography, scanning probe lithography, soft lithography, and three dimensional lithographic methods.

All references cited herein are incorporated herein by reference in their entirety and for all purposes to the same extent as if each individual publication or patent or patent application was specifically and individually indicated to be incorporated by reference in its entirety for all purposes.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method of forming a graphite-based structure on a substrate comprising:
   (A) patterning the substrate thereby forming a plurality of elements on the substrate, each respective element in the plurality of elements separated from an adjacent element on the substrate by a corresponding trench in a plurality of trenches on the substrate, wherein
      (i) each respective element in the plurality of elements has a corresponding top surface,
      (ii) each respective trench in the plurality of trenches is characterized by a trench surface,
      (iii) each respective trench in the plurality of trenches separates a pair of adjacent elements in the plurality of elements,
      (iv) each top surface of each respective element in the plurality of elements is separated from an adjacent trench surface by a side wall of the respective element,
      (v) a top surface of a first element in the plurality of elements is characterized by a first elevation,
      (vi) a trench surface of a first trench in the plurality of trenches, the first trench separating the first element from another element in the plurality of elements, is characterized by a second elevation,
      (vii) the first elevation is other than the second elevation, and
      (viii) a first orthogonal projection of the top surface of the first element and a second orthogonal projection of the trench surface of the first trench onto a common plane are contiguous or overlapping; and
   (B) segmentedly depositing a graphene initiating layer onto the top surface of each respective element in the plurality of elements at an energy level that restricts deposition of the graphene initiating layer to the top surface of each respective element; and
   (C) generating graphene using the graphene initiating layer thereby forming the graphite-based structure.

2. The method of claim 1, wherein the plurality of trenches is formed by removing portions of substrate material from predefined regions of the substrate.

3. The method of claim 2, wherein removing portions of the substrate material includes etching the plurality of trenches into the substrate.

4. The method of claim 3, wherein etching the plurality of trenches into the substrate includes photolithography, x-ray lithography, reactive ion-etching, plasma etching, sputter etching, e-beam direct writing, or a combination thereof.

5. The method of claim 1, wherein:
   the substrate includes a plurality of layers, wherein the plurality of layers includes at least one respective substrate layer and wherein the substrate comprises a plurality of materials, including a respective material of the respective substrate layer; and
   the plurality of trenches is formed by removing portions of the respective material from predefined regions of the respective substrate layer.

6. The method of claim 5, wherein removing portions of the respective material from predefined regions of the respective substrate layer includes etching the plurality of trenches into the respective substrate layer.

7. The method of claim 5, wherein:
   the respective substrate layer comprises a photoresist material; and
   removing portions of the respective material from predefined regions of the respective substrate layer includes removing a portion of the photoresist material using photolithography.

8. The method of claim 1, wherein the plurality of elements is formed by growing portions of substrate material selectively at regions of the substrate corresponding to the plurality of elements.

9. The method of claim 1, wherein the substrate comprises a first material and wherein the plurality of elements is formed by growing at least one respective secondary material, distinct from the first material, selectively on regions of the substrate corresponding to the plurality of elements.

10. The method of claim 9, further comprising iteratively growing the respective secondary material, depositing the graphene-initiating layer, and generating graphene a plurality of times thereby forming alternating layers of the respective secondary material and graphene.

11. The method of claim 9, wherein the respective secondary material comprises one or more of: a dielectric material, a metal oxide, a metal nitride, a semi-conductor material, a metal, or a combination thereof.

12. The method of claim 9, wherein the respective secondary material comprises silicon dioxide, silicon nitride, or a combination thereof.

13. The method of claim 9, wherein the respective secondary material comprises titanium dioxide.

14. The method of claim 9, wherein the respective secondary material comprises titanium nitride.

15. The method of claim 9, wherein the respective secondary material comprises silicon, gallium arsenide, germanium, or a combination thereof.

16. The method of claim 9, wherein the respective secondary material comprises a group VII-IX metal including one or more of metals selected from the group consisting of copper, nickel, iron, platinum, gold, palladium, and ruthenium.

17. The method of claim 9, wherein the respective secondary material comprises aluminum, titanium, tungsten, cadmium, silver, platinum, tantalum, hafnium, vanadium, or a combination thereof.

18. The method of claim 9, wherein the respective secondary material is titanium, titanium dioxide, titanium nitride, or any combination thereof.

19. The method of claim 9, wherein the respective secondary material is tantalum, tantalum oxide, tantalum nitride, or any combination thereof.

20. The method of claim 9, wherein the respective secondary material is hafnium, hafnium oxide, hafnium nitride, or any combination thereof.

* * * * *